(12) United States Patent (10) Patent No.: US 9,123,884 B2
Luo et al. (45) Date of Patent: Sep. 1, 2015

(54) MAGNETORESISTIVE DEVICE AND A WRITING METHOD FOR A MAGNETORESISTIVE DEVICE

(71) Applicant: Agency for Science, Technology and Research, Singapore (SG)

(72) Inventors: Yuanhong Luo, Singapore (SG); Rachid Sbiaa, Singapore (SG); Yan Hwee Sunny Lua, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 275 days.

(21) Appl. No.: 13/623,741

(22) Filed: Sep. 20, 2012

(65) Prior Publication Data

US 2013/0077391 A1 Mar. 28, 2013

Related U.S. Application Data

(60) Provisional application No. 61/537,591, filed on Sep. 22, 2011.

(51) Int. Cl.
 *G11C 11/00* (2006.01)
 *H01L 43/08* (2006.01)

(52) U.S. Cl.
 CPC ..................... *H01L 43/08* (2013.01)

(58) Field of Classification Search
 USPC ......................... 365/158, 171, 173
 See application file for complete search history.

(56) References Cited

U.S. PATENT DOCUMENTS

| 7,599,153 | B2 * | 10/2009 | Lin | ............................. | 360/319 |
| 8,174,873 | B2 * | 5/2012 | Suzuki et al. | ................. | 365/158 |
| 2004/0130929 | A1 * | 7/2004 | Tsang | ........................... | 365/145 |
| 2012/0292723 | A1 | 11/2012 | Luo et al. | | |

OTHER PUBLICATIONS

Zhu et al., Bias-Field-Free Microwave Oscillator Driven by Perpendicularly Polarized Spin Current, 42 IEEE Transactions on Magnetics, 2670 (2006).

* cited by examiner

*Primary Examiner* — Son Dinh
(74) *Attorney, Agent, or Firm* — K. David Crockett, Esq.; Niky Economy Syrengelas, Esq.; Crockett & Crockett, PC

(57) ABSTRACT

According to embodiments of the present invention, a magnetoresistive device is provided. The magnetoresistive device includes at least two ferromagnetic soft layers, wherein the at least two ferromagnetic soft layers have different ranges of magnetization switching frequencies. Further embodiments provide a magnetoresistive device including at least two oscillating ferromagnetic structures, wherein ranges of operating current amplitudes at which oscillations are induced for the at least two oscillating ferromagnetic structures are different. According to further embodiments of the present invention, writing methods for the magnetoresistive devices are provided.

18 Claims, 17 Drawing Sheets

MAGNETORESISTIVE DEVICE AND A WRITING METHOD FOR A MAGNETORESISTIVE DEVICE

CROSS-REFERENCE TO RELATED APPLICATION

This application claims the benefit of priority of U.S. provisional application No. 61/537,591, filed 22 Sep. 2011, the content of which is hereby incorporated by reference in its entirety for all purposes.

TECHNICAL FIELD

Various embodiments relate to a magnetoresistive device and a writing method for a magnetoresistive device.

BACKGROUND

Until now, hard disk drive (HDD) offers an advantage of storing data at low cost. At the same time, other types of memories such as flash memory caught up and now represent a threat to HDD. Flash memory belongs to a category of non-volatile memories (NVM). It allows the data to be stored even when power is down or off.

The flash memory market is getting bigger but the cost per gigabit (Gbit) is higher than that of HDD. HDD technology is moving towards patterned media where bits are made by lithography processes. The cost per Gbit for HDD should not be increased by more than 10% or 20% in order to remain competitive. This is one of the major challenges facing the HDD technology.

A current trend is to develop non-volatile memories (NVM) beyond flash memory, which is cheaper and has a high performance. Magnetoresistive random access memory (MRAM) and phase change random access memory (PC-RAM) represent good candidates for future NVM. It is expected that spin transfer torque magnetoresistive random access memory (STT-MRAM) devices can have a cell less than 10 nm based on high magnetic anisotropy materials used for the storage layer, such as ordered FePt-L$1_0$. However, this is not possible for flash memory.

In order for MRAM to be industrially viable, there is a need to increase the memory storage density of MRAM devices.

SUMMARY

According to an embodiment, a magnetoresistive device is provided. The magnetoresistive device may include at least two ferromagnetic soft layers, wherein the at least two ferromagnetic soft layers have different ranges of magnetization switching frequencies.

According to an embodiment, a writing method for a magnetoresistive device having a first ferromagnetic soft layer and a second ferromagnetic soft layer is provided. The writing method may include applying a signal with a magnetization switching frequency which is within either a range of magnetization switching frequencies of the first ferromagnetic soft layer or a range of magnetization switching frequencies of the second ferromagnetic soft layer.

According to an embodiment, a magnetoresistive device is provided. The magnetoresistive device may include at least two oscillating ferromagnetic structures, wherein ranges of operating current amplitudes at which oscillations are induced for the at least two oscillating ferromagnetic structures are different.

According to an embodiment, a writing method for a magnetoresistive device having a first oscillating ferromagnetic structure and a second oscillating ferromagnetic structure is provided. The writing method may include applying a signal with an operating current amplitude which is within either a range of operating current amplitudes at which oscillations are induced for the first oscillating ferromagnetic structure or a range of operating current amplitudes at which oscillations are induced for the second oscillating ferromagnetic structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
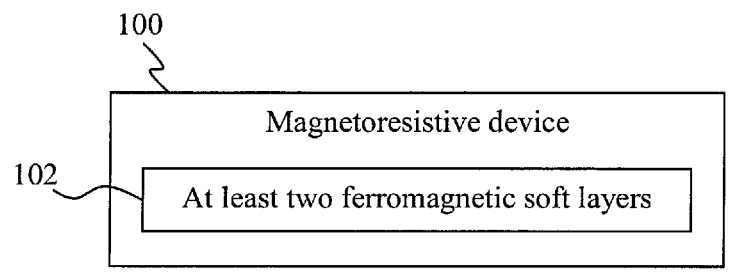
FIG. 1A shows a schematic block diagram of a magnetoresistive device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the phrase "at least substantially" may include "exactly" and a variance of +/−5% thereof. As an example and not limitations, "A is at least substantially same as B" may encompass embodiments where A is exactly the same as B, or where A may be within a variance of +/−5%, for example of a value, of B, or vice versa.

In the context of various embodiments, the term "about" or "approximately" as applied to a numeric value encompasses the exact value and a variance of +/−5% of the value.

As used herein, the term "and/or" includes any and all combinations of one or more of the associated listed items.

Various embodiments relate to a non-volatile magnetic memory device, for example a spin transfer torque magnetoresistive random access memory (STT-MRAM) multi-bit per cell device.

Various embodiments may provide multi-bit per cell for spin transfer torque magnetic memory with frequency selection switching scheme (FSSS) or oscillator selection switching scheme (OSSS).

Various embodiments may provide multi-bit per cell designs or configurations as an approach for increasing the memory storage density in STT-MRAM devices. Various embodiments may provide a multi-bit per cell magnetoresistive device (e.g. a magnetic memory element) with perpendicular magnetization or anisotropy, and spin torque switching.

Various embodiments may provide a magnetoresistive device that may enable switching magnetization by a spin torque effect in perpendicular anisotropy, and a method for switching magnetization by the spin torque effect. The spin torque effect enables the magnetization orientation, for example of a ferromagnetic soft layer, to be switched by using a spin-polarized current or a spin transfer current.

Various embodiments may provide a magnetoresistive device (e.g. a magnetic memory element). The magnetoresistive device may be a giant magnetoresistive (GMR) device or a tunnel magnetoresistive (TMR) device, with a current flowing perpendicular to the plane (CPP) direction.

Various embodiments may provide a multi-bit per cell spin transfer torque magnetoresistive random access memory (STT-MRAM) including at least two soft layers or ferromagnetic soft layers that have different resonance frequencies, and at least an oscillating ferromagnetic structure at the side of each ferromagnetic soft layer to assist the switching of the magnetization orientation of the ferromagnetic soft layer by Frequency Induced Spin Torque Switching (FISTS). Each of the ferromagnetic soft layers has a perpendicular anisotropy component. The STT-MRAM further includes at least one reference layer or ferromagnetic hard layer, with a perpendicular anisotropy component, arranged on one side of the ferromagnetic soft layers. In various embodiments, the oscillating ferromagnetic structure arranged on the other side of each ferromagnetic soft layer may generate an additional effective spin torque field or energy to assist the switching of the ferromagnetic soft layer magnetization. In various embodiments, the properties of each ferromagnetic soft layer and the corresponding oscillating ferromagnetic structure are chosen such that the switching of the ferromagnetic soft layer magnetization orientation may be performed only in a range of frequencies close to the resonance frequency of the ferromagnetic soft layer.

In various embodiments, through matching of the respective resonance frequencies of the ferromagnetic soft layers and the oscillation frequencies of the corresponding oscillating structures, the magnetization orientations of the ferromagnetic soft layers may be switched independently. Such a Frequency Selection Switching Scheme (FSSS) may help to address any related overwriting issue that may occur in multi-bit per cell STT-MRAM. For example, the overwriting issue may arise from delivering more current than required for the switching of the ferromagnetic soft layers during the writing process. This oversupply of the write current, over time, may cause or accelerate the degradation of the performance of the device, thereby affecting its reliability.

In various embodiments, a writing scheme using spin torque effect with selected frequencies to switch the magnetizations of the magnetoresistive devices having multi-bit per cell capability may be provided. The writing scheme may be applied to embodiments having two or more ferromagnetic soft layers, with associated additional ferromagnetic hard layer(s).

Various embodiments may provide a multi-bit per cell spin transfer torque magnetoresistive random access memory (STT-MRAM) including at least two soft layers or ferromagnetic soft layers that have different resonance frequencies, and at least an oscillating ferromagnetic structure at the side of each ferromagnetic soft layer to assist the switching of the magnetization of the ferromagnetic soft layer by an Oscillator Selection Switching Scheme (OSSS). Each of the ferromagnetic soft layers has a perpendicular anisotropy component. The STT-MRAM further includes at least one reference layer or ferromagnetic hard layer, with a perpendicular anisotropy component, arranged on one side of the ferromagnetic soft layers. In various embodiments, the oscillating ferromagnetic structure arranged on the other side of each ferromagnetic soft layer may generate an additional effective spin torque field or energy to assist the switching of the ferromagnetic soft layer magnetization. In various embodiments, the oscillating ferromagnetic structures may be designed or engineered differently so that they have different critical current densities or current amplitudes.

In various embodiments, the Oscillator Selection Switching Scheme (OSSS) may also be employed even if the at least two ferromagnetic soft layers have the same resonance frequency. By design, the oscillating structures are not "ON" at the same time, and therefore, the magnetization orientation of only one ferromagnetic soft layer is switched at any one time.

In various embodiments, through selection of the respective critical current densities of the oscillating ferromagnetic structures, the magnetizations orientation of the corresponding ferromagnetic soft layers may be switched independently. Such an Oscillator Selection Switching Scheme (OSSS) may help to address any related overwriting issue that may occur in multi-bit per cell STT-MRAM. For example, the overwriting issue may arise from delivering more current than required for the switching of the ferromagnetic soft layers during the writing process. This oversupply of the write current, over time, may cause or accelerate the degradation of the performance of the device, thereby affecting its reliability.

In various embodiments, a writing scheme using spin torque effect with selected critical current densities to switch the magnetizations of the magnetoresistive devices having multi-bit per cell capability may be provided. The writing scheme may be applied to embodiments having two or more ferromagnetic soft layers, with associated additional ferromagnetic hard layer(s).

FIG. 1A shows a schematic block diagram of a magnetoresistive device 100, according to various embodiments. The magnetoresistive device 100 includes at least two ferromagnetic soft layers 102 (e.g. 204a, 204b, FIGS. 2A, 13A, 13B, 14), wherein the at least two ferromagnetic soft layers 102 have different ranges of magnetization switching frequencies. The range of magnetization switching frequencies of each ferromagnetic soft layer 102 may be a frequency bandwidth of the ferromagnetic soft layer 102.

In other words, the magnetoresistive device 100 may have two or more ferromagnetic soft layers 102, e.g. two, three, four, five or any higher number of ferromagnetic soft layers 102. These ferromagnetic soft layers 102 may form part of a magnetic junction of the magnetoresistive device 100.

Each ferromagnetic soft layer 102 has a range of magnetization switching frequencies. In various embodiments, the range of magnetization switching frequencies of each ferromagnetic soft layer 102 may be non-overlapping, e.g. the range of magnetization switching frequencies of a ferromagnetic soft layer 102 (e.g. 204a) occurs at a frequency range different from that of another ferromagnetic soft layer 102 (e.g. 204b). In various embodiments, the range of magnetization switching frequencies of each ferromagnetic soft layer 102 may be substantially non-overlapping, e.g. the range of magnetization switching frequencies of each ferromagnetic soft layer 102 has a tolerable overlapping region. This may mean that a small overlap, for example an overlap of a small range between the respective ranges of the magnetization switching frequencies of the ferromagnetic soft layers 102, may be tolerated as long as there is a portion or region of the range of magnetization switching frequencies of each ferromagnetic soft layer 102 for which independent or individual switching of each ferromagnetic soft layer 102 is possible.

It should be appreciated that the at least two ferromagnetic soft layers 102 may have one or more ferromagnetic soft layers 102 that may have non-overlapping ranges of magnetization switching frequencies, and/or one or more ferromagnetic soft layers 102 that may have substantially non-overlapping ranges of magnetization switching frequencies.

In various embodiments, the range of magnetization switching frequencies of each ferromagnetic soft layer 102 may be close to a resonance frequency of the ferromagnetic soft layer 102. Each ferromagnetic soft layer 102 may be associated with an optimum magnetization switching frequency that is within the range of magnetization switching frequencies of the ferromagnetic soft layer 102. The optimum magnetization switching frequency of each ferromagnetic soft layer 102 may be close to or equal to a resonance frequency of the ferromagnetic soft layer 102.

In various embodiments, the range of magnetization switching frequencies of each ferromagnetic soft layer 102 may be dependent on a current density applied to the magnetoresistive device 100.

In various embodiments, each ferromagnetic soft layer 102 may have a corresponding oscillating ferromagnetic structure disposed on one side of the ferromagnetic soft layer 102. In other words, the magnetoresistive device 100 may have an oscillating ferromagnetic structure corresponding to each ferromagnetic soft layer 102, and disposed on one side of the ferromagnetic soft layer 102. These oscillating ferromagnetic structures (e.g. 206a, 206b), together with the ferromagnetic soft layers 102, may form part of a magnetic junction of the magnetoresistive device 100.

In various embodiments, the optimum magnetization switching frequency of each ferromagnetic soft layer 102 may be the magnetization switching frequency at which magnetization of the ferromagnetic soft layer 102 may switch in the fastest time (or shortest time) for a current pulse of a particular amplitude and time width. The optimum magnetization switching frequency of each ferromagnetic soft layer 102 may be dependent on a perpendicular magnetic anisotropy field of the ferromagnetic soft layer 102. Each ferromagnetic soft layer 102 may have a different perpendicular magnetic anisotropy field. In various embodiments, the optimum magnetization switching frequency of each ferromagnetic soft layer 102 may be close to an oscillation frequency of the corresponding oscillating ferromagnetic structure.

In various embodiments, the optimum magnetization switching frequency of each ferromagnetic soft layer 102 may be dependent on one or more of a saturation magnetization of the ferromagnetic soft layer 102 and a thickness of the ferromagnetic soft layer 102. Each ferromagnetic soft layer 102 may have a different saturation magnetization and/or a different thickness.

In the context of various embodiments, the magnetoresistive device 100 may include a first stack arrangement (e.g. 200, FIGS. 2A, 13A, 13B, 14) including a ferromagnetic hard layer (e.g. 202), a first ferromagnetic soft layer (e.g. 204a), a second ferromagnetic soft layer (e.g. 204b), a first oscillating ferromagnetic structure (e.g. 206a), and a second oscillating ferromagnetic structure (e.g. 206b), wherein the first oscillating ferromagnetic structure is disposed at one side of the first ferromagnetic soft layer and the second oscillating ferromagnetic structure is disposed at one side of the second ferromagnetic soft layer, and wherein the ferromagnetic hard layer is disposed at the other side of each of the first ferromagnetic soft layer and the second ferromagnetic soft layer such that the ferromagnetic hard layer is disposed between the first ferromagnetic soft layer and the second ferromagnetic soft layer. In other words, the at least two ferromagnetic soft layers 102 may include the first ferromagnetic soft layer and the second ferromagnetic soft layer as described above. The corresponding oscillating ferromagnetic structure disposed on one side of the ferromagnetic soft layer 102 may include the first oscillating ferromagnetic structure and the second oscillating ferromagnetic structure as described above.

The first stack arrangement may further include a first separating layer (e.g. 208a) disposed between the ferromagnetic hard layer and the first ferromagnetic soft layer, a second separating layer (e.g. 208b) disposed between the ferromagnetic hard layer and the second ferromagnetic soft layer, a third separating layer (e.g. 210a) disposed between the first oscillating ferromagnetic structure and the first ferromagnetic soft layer, and a fourth separating layer (e.g. 210b) disposed between the second oscillating ferromagnetic structure and the second ferromagnetic soft layer.

In the context of various embodiments, the first separating layer, the second separating layer, the third separating layer and the fourth separating layer include non-magnetic materials.

In the context of various embodiments, the first separating layer and the second separating layer include non-conductive materials (e.g. an insulator), e.g. magnesium oxide (MgO). By arranging insulators as separating layers between the ferromagnetic hard layer with the first ferromagnetic soft layer and the second ferromagnetic soft layer, the magnetoresistive device 100 may be configured as a tunnel magnetoresistive (TMR) device.

However, it should be appreciated that the first separating layer and the second separating layer may include conductive materials (e.g. a conductor), e.g. copper (Cu). By arranging conductors as separating layers between the ferromagnetic hard layer with the first ferromagnetic soft layer and the second ferromagnetic soft layer, the magnetoresistive device 100 may be configured as a giant magnetoresistive (GMR) device.

In the context of various embodiments, the third separating layer and the fourth separating layer include conductive materials (e.g. a conductor), e.g. copper (Cu).

In the context of various embodiments, one of or each of the first separating layer and the second separating layer may have a thickness ranging from about 0.4 nm to about 1.5 nm, e.g. about 0.4 nm to about 1.0 nm, about 0.4 nm to about 0.8 nm, about 0.8 nm to about 1.5 nm or about 0.6 nm to about 1.2 nm.

In the context of various embodiments, the first stack arrangement may be or may form part of a 2-bit per cell spin transfer torque magnetoresistive random access memory (STT-MRAM). In other words, the magnetoresistive device 100 with the first stack arrangement may provide one, two, three, or four resistance states, which may enable data storage of up to two bits of information, thereby allowing multi-state or multi-bit storage.

In the context of various embodiments, the magnetoresistive device 100 may further include a second stack arrangement (e.g. 220, FIGS. 13A, 13B) including a further ferromagnetic hard layer (e.g. 222, FIGS. 13A, 13B), a third ferromagnetic soft layer (e.g. 224), and a third oscillating ferromagnetic structure (e.g. 226), wherein the third ferromagnetic soft layer is disposed between the further ferromagnetic hard layer and the third oscillating ferromagnetic structure. The second stack arrangement may further include a fifth separating layer (e.g. 228) disposed between the further ferromagnetic hard layer and the third ferromagnetic soft layer, and a sixth separating layer (e.g. 230) disposed between the third ferromagnetic soft layer and the third oscillating ferromagnetic structure.

In the context of various embodiments, the fifth separating layer and the sixth separating layer include non-magnetic materials.

In the context of various embodiments, the fifth separating layer includes non-conductive materials (e.g. as insulator), e.g. magnesium oxide (MgO). By arranging an insulator as a separating layer between the further ferromagnetic hard layer and the third ferromagnetic soft layer, the magnetoresistive device 100 may be configured as a tunnel magnetoresistive (TMR) device.

However, it should be appreciated that the fifth separating layer may include conductive materials (e.g. as conductor), e.g. copper (Cu). By arranging a conductor as a separating layer between the further ferromagnetic hard layer and the third ferromagnetic soft layer, the magnetoresistive device 100 may be configured as a giant magnetoresistive (GMR) device.

In the context of various embodiments, the sixth separating layer includes conductive materials (e.g. a conductor), e.g. copper (Cu).

In the context of various embodiments, the second stack arrangement may be or may form part of a 1-bit per cell spin transfer torque magnetoresistive random access memory (STT-MRAM).

In the context of various embodiments, the second stack arrangement may be disposed above or below the first stack arrangement. In other words, the first stack arrangement and the second stack arrangement may be arranged one over the other. The magnetoresistive device 100 may further include a seventh separating layer (e.g. 1302) disposed between the second stack arrangement and the first stack arrangement. The seventh separating layer may include non-magnetic materials. The seventh separating layer may include conductive materials, e.g. copper (Cu).

In the context of various embodiments, the first stack arrangement and the second stack arrangement may be or may form part of a 3-bit per cell spin transfer torque magnetoresistive random access memory (STT-MRAM). In other words, the magnetoresistive device 100 with the first stack arrangement and the second stack arrangement may provide one, two, three, four, five, six, seven or eight resistance states, which may enable data storage of up to three bits of information, thereby allowing multi-state or multi-bit storage.

In the context of various embodiments, the magnetoresistive device 100 including the first stack arrangement may further include a further first stack arrangement (e.g. 1401, FIG. 14), e.g. a further stack arrangement similar to the first stack arrangement, wherein the further first stack arrangement is disposed above or below the first stack arrangement. In other words, the two first stack arrangements may be arranged one over the other. The magnetoresistive device 100 may further include an eighth separating layer (e.g. 1412) disposed between the first stack arrangement and the further first stack arrangement. The eight separating layer may include non-magnetic materials. The eight separating layer may include conductive materials, e.g. copper (Cu).

In the context of various embodiments, the first stack arrangement and the further first stack arrangement may be or may form part of a 4-bit per cell spin transfer torque magnetoresistive random access memory (STT-MRAM). In other words, the magnetoresistive device 100 with the first stack arrangement and the further first stack arrangement may provide between one to sixteen resistance states, which may enable data storage of up to four bits of information, thereby allowing multi-state or multi-bit storage.

In the context of various embodiments, it should be appreciated that any n-bit per cell spin transfer torque magnetoresistive random access memory (STT-MRAM) may be formed by providing a combination of any number of the first stack arrangement, where each first stack arrangement may provide 2-bit per cell STT-MRAM, and/or any number of the second stack arrangement, where each second stack arrangement may provide 1-bit per cell STT-MRAM. In the context of various embodiments, a conductive and non-magnetic separating layer may be disposed between any two stack arrangements.

Figure 1B:
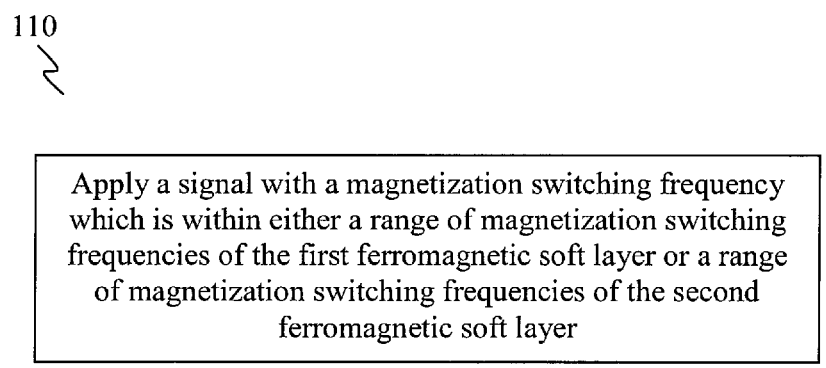
FIG. 1B illustrates a writing method for a magnetoresistive device, according to various embodiments.

FIG. 1B illustrates a writing method 110 for a magnetoresistive device, according to various embodiments, where the magnetoresistive device may have a first ferromagnetic soft layer and a second ferromagnetic soft layer. For the writing method 110, a signal with a magnetization switching frequency which is within either a range of magnetization switching frequencies of the first ferromagnetic soft layer or a range of magnetization switching frequencies of the second ferromagnetic soft layer is applied.

When the magnetization switching frequency of the signal is within the range of magnetization switching frequencies of the first ferromagnetic soft layer, the magnetization of the first ferromagnetic soft layer is switched, and when the magnetization switching frequency of the signal is within the range of magnetization switching frequencies of the second ferromagnetic soft layer, the magnetization of the second ferromagnetic soft layer is switched. In various embodiments, the range of magnetization switching frequencies of the first ferromagnetic soft layer may be non-overlapping or substantially non-overlapping with the range of magnetization switching frequencies of the second ferromagnetic soft layer, e.g. the ranges of the magnetization switching frequencies of the first ferromagnetic soft layer and the second ferromagnetic soft layer may be different.

Figure 1C:
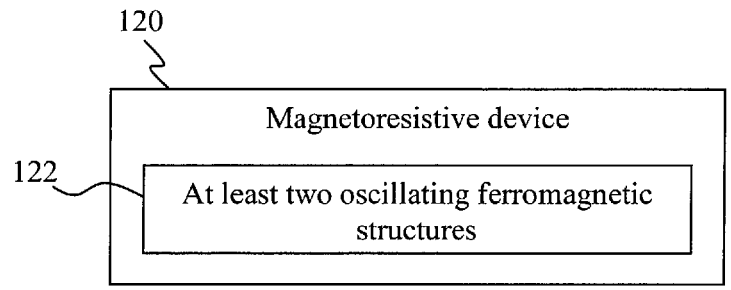
FIG. 1C shows a schematic block diagram of a magnetoresistive device, according to various embodiments.

FIG. 1C shows a schematic block diagram of a magnetoresistive device 120, according to various embodiments. The magnetoresistive device 120 includes at least two oscillating ferromagnetic structures 122 (e.g. 206a, 206b, FIGS. 2A, 13A, 13B, 14), wherein ranges of operating current amplitudes (or current densities) at which oscillations are induced for the at least two oscillating ferromagnetic structures 122 are different.

In other words, the magnetoresistive device 120 may have two or more oscillating ferromagnetic structures 122, e.g. two, three, four, five or any higher number of oscillating ferromagnetic structures 122. These oscillating ferromagnetic structures 122 may form part of a magnetic junction of the magnetoresistive device 120.

The magnetoresistive device 120 may further include at least two ferromagnetic soft layers (e.g. 204a, 204b) wherein each oscillating ferromagnetic structure 122 may be disposed at one side of a corresponding ferromagnetic soft layer. In other words, the magnetoresistive device 120 may have a ferromagnetic soft layer corresponding to each oscillating ferromagnetic structure 122, and disposed on one side of the oscillating ferromagnetic structure 122. These ferromagnetic soft layers, together with the oscillating ferromagnetic structures 122, may form part of a magnetic junction of the magnetoresistive device 100.

Each oscillating ferromagnetic structure 122 has a range of operating current amplitudes at which oscillations are induced. In various embodiments, the ranges of operating current amplitudes at which oscillations are induced for the at least two oscillating ferromagnetic structures 122 may be non-overlapping, e.g. the range of operating current amplitudes of an oscillating ferromagnetic structures 122 occurs at a current amplitude range different from that of another oscillating ferromagnetic structures 122. In various embodiments, the ranges of operating current amplitudes at which oscillations are induced for the at least two oscillating ferromagnetic structures 122 may be substantially non-overlapping, e.g. the ranges of operating current amplitudes may have a tolerable overlapping region respectively. This may mean that a small overlap, for example an overlap of a small range between the respective ranges of operating current amplitudes, may be tolerated as long as there is a portion or region of the operating current amplitudes of each oscillating ferromagnetic structures 122 for which independent or individual switching of the corresponding ferromagnetic soft layer is possible.

It should be appreciated that the at least two oscillating ferromagnetic structures 122 may have one or more oscillating ferromagnetic structures 122 that may have non-overlapping ranges of operating current amplitudes, and/or one or more oscillating ferromagnetic structures 122 that may have substantially non-overlapping ranges of operating current amplitudes.

In various embodiments, each ferromagnetic soft layer may configured to switch magnetization from a parallel state to an anti-parallel state (P→AP) or from an anti-parallel state to a parallel state (AP→P) when an operating current amplitude is within the range of operating current amplitudes at which oscillations are induced for the corresponding oscillating ferromagnetic structure 122.

In various embodiments, each oscillating ferromagnetic structure 122 has an oscillation frequency. The range of operating current amplitudes at which oscillations are induced for each oscillating ferromagnetic structure 122 and the oscillation frequency of each oscillating ferromagnetic structure 122 may be dependent on one or more of a group of parameters consisting of Gilbert damping constant of the oscillating ferromagnetic structure, saturation magnetization of the oscillating ferromagnetic structure, perpendicular anisotropy field of the oscillating ferromagnetic structure and thickness of the oscillating ferromagnetic structure.

In the context of various embodiments, the magnetoresistive device 120 may include a first stack arrangement e.g. 200, FIGS. 2A, 13A, 13B, 14) including a ferromagnetic hard layer (e.g. 202), a first ferromagnetic soft layer (e.g. 204a), a second ferromagnetic soft layer (e.g. 204b), a first oscillating ferromagnetic structure (e.g. 206a), and a second oscillating ferromagnetic structure (e.g. 206b), wherein the first oscillating ferromagnetic structure is disposed at one side of the first ferromagnetic soft layer and the second oscillating ferromagnetic structure is disposed at one side of the second ferromagnetic soft layer, and wherein the ferromagnetic hard layer is disposed at the other side of each of the first ferromagnetic soft layer and the second ferromagnetic soft layer such that the ferromagnetic hard layer is disposed between the first ferromagnetic soft layer and the second ferromagnetic soft layer. In other words, the at least two oscillating ferromagnetic structures 122 may include the first oscillating ferromagnetic structure and the second oscillating ferromagnetic structure as described above. The corresponding ferromagnetic soft layer disposed on one side of the oscillating ferromagnetic structure 122 may include the first ferromagnetic soft layer and the second ferromagnetic soft layer as described above.

The first stack arrangement may further include a first separating layer (e.g. 208a) disposed between the ferromagnetic hard layer and the first ferromagnetic soft layer, a second separating layer (e.g. 208b) disposed between the ferromagnetic hard layer and the second ferromagnetic soft layer, a third separating layer (e.g. 210a) disposed between the first oscillating ferromagnetic structure and the first ferromagnetic soft layer, and a fourth separating layer (e.g. 210b) disposed between the second oscillating ferromagnetic structure and the second ferromagnetic soft layer.

In the context of various embodiments, the first separating layer, the second separating layer, the third separating layer and the fourth separating layer include non-magnetic materials.

In the context of various embodiments, the first separating layer and the second separating layer include non-conductive materials (e.g. an insulator), e.g. magnesium oxide (MgO). By arranging insulators as separating layers between the ferromagnetic hard layer with the first ferromagnetic soft layer and the second ferromagnetic soft layer, the magnetoresistive device 120 may be configured as a tunnel magnetoresistive (TMR) device.

However, it should be appreciated that the first separating layer and the second separating layer may include conductive materials (e.g. a conductor), e.g. Cu. By arranging conductors as separating layers between the ferromagnetic hard layer with the first ferromagnetic soft layer and the second ferromagnetic soft layer, the magnetoresistive device 120 may be configured as a giant magnetoresistive (GMR) device.

In the context of various embodiments, the third separating layer and the fourth separating layer include conductive materials (e.g. a conductor), e.g. copper (Cu).

In the context of various embodiments, one of or each of the first separating layer and the second separating layer may have a thickness ranging from about 0.4 nm to about 1.5 nm, e.g. about 0.4 nm to about 1.0 nm, about 0.4 nm to about 0.8 nm, about 0.8 nm to about 1.5 nm or about 0.6 nm to about 1.2 nm.

In the context of various embodiments, the first stack arrangement may be or may form part of a 2-bit per cell spin transfer torque magnetoresistive random access memory (STT-MRAM). In other words, the magnetoresistive device 120 with the first stack arrangement may provide one, two, three, or four resistance states, which may enable data storage of up to two bits of information, thereby allowing multi-state or multi-bit storage.

In the context of various embodiments, the magnetoresistive device 120 may further include a second stack arrangement (e.g. 220, FIGS. 13A, 13B) including a further ferromagnetic hard layer (e.g. 222), a third ferromagnetic soft layer (e.g. 224), and a third oscillating ferromagnetic structure (e.g. 226), wherein the third ferromagnetic soft layer is disposed between the further ferromagnetic hard layer and the third oscillating ferromagnetic structure. The second stack arrangement may further include a fifth separating layer (e.g. 228) disposed between the further ferromagnetic hard layer and the third ferromagnetic soft layer, and a sixth separating layer (e.g. 230) disposed between the third ferromagnetic soft layer and the third oscillating ferromagnetic structure.

In the context of various embodiments, the fifth separating layer and the sixth separating layer include non-magnetic materials.

In the context of various embodiments, the fifth separating layer includes non-conductive materials (e.g. as insulator), e.g. magnesium oxide (MgO). By arranging an insulator as a separating layer between the further ferromagnetic hard layer and the third ferromagnetic soft layer, the magnetoresistive device 120 may be configured as a tunnel magnetoresistive (TMR) device.

However, it should be appreciated that the fifth separating layer may include conductive materials (e.g. as conductor), e.g. copper (Cu). By arranging a conductor as a separating layer between the further ferromagnetic hard layer and the third ferromagnetic soft layer, the magnetoresistive device 120 may be configured as a giant magnetoresistive (GMR) device.

In the context of various embodiments, the sixth separating layer includes conductive materials (e.g. a conductor), e.g. copper (Cu).

In the context of various embodiments, the second stack arrangement may be or may form part of a 1-bit per cell spin transfer torque magnetoresistive random access memory (STT-MRAM).

In the context of various embodiments, the second stack arrangement may be disposed above or below the first stack arrangement. In other words, the first stack arrangement and the second stack arrangement may be arranged one over the other. The magnetoresistive device 120 may further include a seventh separating layer (e.g. 1302) disposed between the second stack arrangement and the first stack arrangement. The seventh separating layer may include non-magnetic materials. The seventh separating layer may include conductive materials, e.g. copper (Cu).

In the context of various embodiments, the first stack arrangement and the second stack arrangement may be or may form part of a 3-bit per cell spin transfer torque magnetoresistive random access memory (STT-MRAM). In other words, the magnetoresistive device 120 with the first stack arrangement and the second stack arrangement may provide one, two, three, four, five, six, seven or eight resistance states, which may enable data storage of up to three bits of information, thereby allowing multi-state or multi-bit storage.

In the context of various embodiments, the magnetoresistive device 120 including the first stack arrangement may further include a further first stack arrangement (e.g. 1401, FIG. 14), e.g. a further stack arrangement similar to the first stack arrangement, wherein the further first stack arrangement is disposed above or below the first stack arrangement. In other words, the two first stack arrangements may be arranged one over the other. The magnetoresistive device 120 may further include an eighth separating layer (e.g. 1412) disposed between the first stack arrangement and the further first stack arrangement. The eight separating layer may include non-magnetic materials. The eight separating layer may include conductive materials, e.g. copper (Cu).

In the context of various embodiments, the first stack arrangement and the further first stack arrangement may be or may form part of a 4-bit per cell spin transfer torque magnetoresistive random access memory (STT-MRAM). In other words, the magnetoresistive device 120 with the first stack arrangement and the further first stack arrangement may provide between one to sixteen resistance states, which may enable data storage of up to four bits of information, thereby allowing multi-state or multi-bit storage.

In the context of various embodiments, it should be appreciated that any n-bit per cell spin transfer torque magnetoresistive random access memory (STT-MRAM) may be formed by providing a combination of any number of the first stack arrangement, where each first stack arrangement may provide 2-bit per cell STT-MRAM, and/or any number of the second stack arrangement, where each second stack arrangement may provide 1-bit per cell STT-MRAM. In the context of various embodiments, a conductive and non-magnetic separating layer may be disposed between any two stack arrangements.

In the context of various embodiments, a combination of any number of the first stack arrangement, where each first stack arrangement may provide 2-bit per cell STT-MRAM, and/or any number of the second stack arrangement, where each second stack arrangement may provide 1-bit per cell STT-MRAM, may be provided as part of a magnetic junction of a magnetoresistive device.

Figure 1D:
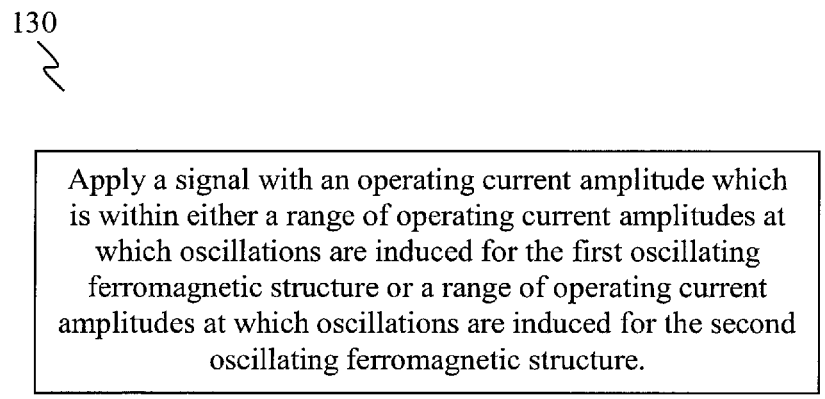
FIG. 1D illustrates a writing method for a magnetoresistive device, according to various embodiments.

FIG. 1D illustrates a writing method 130 for a magnetoresistive device, according to various embodiments, where the magnetoresistive device may have a first oscillating ferromagnetic structure and a second oscillating ferromagnetic structure. For the writing method 130, a signal with an operating current amplitude which is within either a range of operating current amplitudes at which oscillations are induced for the first oscillating ferromagnetic structure or a range of operating current amplitudes at which oscillations are induced for the second oscillating ferromagnetic structure is applied.

When the operating current amplitude of the signal is within the range of operating current amplitudes at which oscillations are induced for the first oscillating ferromagnetic structure, the magnetization of the first oscillating ferromagnetic structure oscillates, which may cause the magnetization of the corresponding first ferromagnetic soft layer to switch, and when the operating current amplitude of the signal is within the range of operating current amplitudes at which oscillations are induced for the second oscillating ferromagnetic structure, the magnetization of the second oscillating ferromagnetic structure oscillates, which may cause the magnetization of the corresponding second ferromagnetic soft layer to switch. In various embodiments, the range of operating current amplitudes at which oscillations are induced for the first oscillating ferromagnetic structure may be non-overlapping or substantially non-overlapping with the range of operating current amplitudes at which oscillations are induced for the second oscillating ferromagnetic structure, e.g. the ranges of the operating current amplitudes at which oscillations are induced for the first oscillating ferromagnetic structure and the second oscillating ferromagnetic structure may be different.

In the context of various embodiments, the writing method 110 and/or the writing method 130 may be applied to the magnetoresistive device 100 and/or the magnetoresistive device 120 of various embodiments.

Features or components of the magnetoresistive device 120 that are similarly present in the magnetoresistive device 100 may be as described in the context of the magnetoresistive device 100, and vice versa.

In the context of various embodiments, the magnetoresistive device 100 and/or the magnetoresistive device 120 may be or may form part of a spin transfer torque magnetoresistive random access memory (STT-MRAM) with perpendicular anisotropy (p-STT-MRAM).

The magnetization orientations or directions of the respective magnetic layers, e.g. the ferromagnetic soft layers and the ferromagnetic hard layers, are configured to orient in a direction at least substantially perpendicular to a plane defined by an interface between the magnetic layers. In other words, the ferromagnetic soft layers and the ferromagnetic hard layers have their magnetic easy axis (e.g. magnetization orientation or direction) aligned in a perpendicular direction (i.e. perpendicular anisotropy), for example in a direction at least substantially perpendicular to a plane defined by an interface between the magnetic layers.

In the context of various embodiments, the term "easy axis" as applied to magnetism may mean an energetically favorable direction of spontaneous magnetization as a result of magnetic anisotropy. The magnetization orientation may be either of two opposite directions along the easy axis.

In the context of various embodiments, a ferromagnetic hard layer may mean a magnetic layer having a fixed magnetization orientation or direction. The ferromagnetic hard layer may include a hard ferromagnetic material, which may be resistant to magnetization and demagnetization (i.e. not easily magnetized and demagnetized), and may have a high hysteresis loss and a high coercivity. In the context of various embodiments, a ferromagnetic hard layer may also be referred to as a fixed magnetic layer. In the context of various embodiments, the ferromagnetic hard layer may act as a reference layer.

In the context of various embodiments, a ferromagnetic hard layer may include at least one of iron (Fe), cobalt (Co) or nickel (Ni). In various embodiments, the ferromagnetic hard layer may include cobalt-iron-boron (CoFeB), a (Co/Ni) bilayer structure, or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt), iron-platinum (FePt) alloy, cobalt-platinum (CoPt) alloy, cobalt-iron (CoFe) and any combination thereof. For example, the ferromagnetic hard layer may include a bilayer or a multilayer of (Co/X), (CoFe/X) or (CoFeB/X) where X is palladium (Pd), platinum (Pt), FePt alloy, CoPt alloy, CoFe or any combination of these materials. Any combination of cobalt-iron-boron (CoFeB), (Co/Ni) multilayer, (Co/X) multilayer, (CoFe/X) multilayer and (CoFeB/X) multilayer may also be provided. As a non-limiting example, the ferromagnetic hard layer may include $(CoFe/Pd)_5$, of 5 layers of CoFe arranged alternately with 5 layers of Pd, i.e. (CoFe/Pd/CoFe/Pd/CoFe/Pd/CoFe/Pd/CoFe/Pd). In embodiments with a multilayer structure, the number of repeats of bilayer structures may be more than or equal to 2, e.g. 3, 4, 5 or any higher number.

In the context of various embodiments, a ferromagnetic hard layer may have a thickness in a range of between about 3 nm and about 50 nm, e.g. between about 3 nm and about 20 nm, between about 3 nm and about 10 nm, between about 10 nm and about 50 nm, between about 30 nm and about 50 nm or between about 5 nm and about 20 nm.

In the context of various embodiments, a ferromagnetic soft layer may mean a magnetic layer having a varying or variable magnetization orientation or direction. In other words, the magnetization orientation may be changed or varied, for example by applying a current, such as a spin-polarized current. The ferromagnetic soft layer may include a soft ferromagnetic material, which may be receptive to magnetization and demagnetization (i.e. easily magnetized and demagnetized), and may have a small hysteresis loss and a low coercivity. In the context of various embodiments, a ferromagnetic soft layer may also be referred to as a free magnetic layer. In the context of various embodiments, the ferromagnetic soft layer may act as a storage layer.

In the context of various embodiments, a ferromagnetic soft layer may include at least one of iron (Fe), cobalt (Co) or nickel (Ni). In various embodiments, the ferromagnetic soft layer may include cobalt-iron-boron (CoFeB), a (Co/Ni) bilayer structure, or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt), iron-platinum (FePt) alloy, cobalt-platinum (CoPt) alloy, cobalt-iron (CoFe) and any combination thereof. For example, the ferromagnetic soft layer may include a bilayer or a multilayer of (Co/X), (CoFe/X) or (CoFeB/X) where X is palladium (Pd), platinum (Pt), FePt alloy, CoPt alloy, CoFe or any combination of these materials. Any combination of cobalt-iron-boron (CoFeB), (Co/Ni) multilayer, (Co/X) multilayer, (CoFe/X) multilayer and (CoFeB/X) multilayer may also be provided. As a non-limiting example, the ferromagnetic soft layer may include $(CoFe/Pd)_5$, of 5 layers of CoFe arranged alternately with 5 layers of Pd, i.e. (CoFe/Pd/CoFe/Pd/CoFe/Pd/CoFe/Pd/CoFe/Pd). In embodiments with a multilayer structure, the number of repeats of bilayer structures may be more than or equal to 2, e.g. 3, 4, 5 or any higher number.

In the context of various embodiments, a ferromagnetic soft layer may have a thickness in a range of between about 0.3 nm and about 4 nm, for example between about 0.3 nm and about 2 nm, between about 0.3 nm and about 1 nm or between about 1 nm and about 4 nm.

In the context of various embodiments, the magnetization orientation of a ferromagnetic soft layer may be in one of two directions. The ferromagnetic soft layer may be in a parallel state (P) or an anti-parallel state (AP) with respect to a ferromagnetic hard layer. In the parallel state, the magnetization orientation of the ferromagnetic soft layer is parallel to the magnetization orientation of the ferromagnetic hard layer, such that the two magnetization orientations are in the same direction. In the anti-parallel state, the magnetization orientation of the ferromagnetic soft layer is anti-parallel to the magnetization orientation of the ferromagnetic hard layer, such that the two magnetization orientations are in opposite directions.

In the context of various embodiments, an oscillating ferromagnetic structure or layer may mean a magnetic layer with a magnetization orientation or direction which is configured to oscillate or precess in a direction in response to a current or a voltage applied across the magnetoresistive device. The oscillating ferromagnetic structure may change the magnetization orientation of the corresponding ferromagnetic soft layer as a result of the oscillation or precession, for example due to spin transfer torque. The oscillation may be in a circular direction or resembling a cone direction, and for example may be a clockwise direction or an anti-clockwise direction.

In the context of various embodiments, a separating layer may be of a conductive and non-magnetic material, or a non-conductive and non-magnetic material. In various embodiments, a separating layer having or of a conductive and non-magnetic material (e.g. an electrical conductor) may include but not limited to any one of or any combination of copper (Cu), silver (Ag), gold (Au), tantalum (Ta), chromium (Cr), palladium (Pd), platinum (Pt), iridium (Ir), rhodium (Rh) or ruthenium (Ru). In various embodiments, a separating layer having or of a non-conductive and non-magnetic material (e.g. an insulator) may include but not limited to any one of or any combination of magnesium oxide (MgO), alumina ($AlO_x$) or titanium oxide ($TiO_x$). In the context of various embodiments, a separation layer may also be referred to as a spacer layer.

In the context of various embodiments, where a separating layer is of a conductive and non-magnetic material, the separating layer may have a thickness of between about 1 nm and about 20 nm, e.g. between about 1 nm and about 10 nm, between about 1 nm and about 5 nm, between about 5 nm and about 20 nm, between about 5 nm and about 10 nm, or between about 1.5 nm and about 5 nm.

In the context of various embodiments, where a separating layer is of a non-conductive and non-magnetic material, the separating layer may have a thickness ranging from about 0.3 nm to about 2.0 nm, e.g. about 0.3 nm to about 1.5 nm, about 0.3 nm to about 0.8 nm, about 0.8 nm to about 2.0 nm, about 0.8 nm to about 1.5 nm or about 0.6 nm to about 1.2 nm.

In the context of various embodiments, the terms "first" and "second" with respect to a feature (e.g. ferromagnetic soft layer) refer to separate but similar features. The terms may be interchangeable, for example depending on the arrangement of the magnetoresistive device. For example, where two ferromagnetic soft layers are arranged one above the other, the bottom ferromagnetic soft layer may be termed as "first ferromagnetic soft layer" while the top ferromagnetic soft layer may be termed as "second ferromagnetic soft layer", or vice versa.

In the context of various embodiments, the term "magnetization switching frequencies" with respect to a ferromagnetic soft layer may mean a range of frequencies at which the ferromagnetic soft layer may switch its magnetization orientation.

In the context of various embodiments, the term "optimum magnetization switching frequency" with respect to a ferromagnetic soft layer may mean a particular frequency at which the ferromagnetic soft layer may switch its magnetization orientation, close to or equal to a resonance frequency of the ferromagnetic soft layer.

In the context of various embodiments, the term "resonance frequency" with respect to a ferromagnetic soft layer may refer to the frequency of the ferromagnetic soft layer at which the ferromagnetic soft layer may switch with the smallest critical current for a given pulse length and amplitude, or equivalently may switch in the fastest time for a given current pulse time width and amplitude. The term "resonance frequency" with respect to a ferromagnetic soft layer may also refer to the oscillating frequency of the oscillating ferromagnetic structure at which the corresponding ferromagnetic soft layer may switch with the smallest critical current for a given pulse length and amplitude, or equivalently may switch in the fastest time for a given current pulse time width and amplitude.

In the context of various embodiments, the term "perpendicular magnetic anisotropy field" may mean a magnetic field in the perpendicular direction of a ferromagnetic layer, e.g. perpendicular to a surface of the ferromagnetic layer, which may interface with another ferromagnetic layer.

In the context of various embodiments, the term "saturation magnetization" may mean the maximum induced magnetic moment that may be obtained for a material in a magnetic field, which beyond this field no further increase in magnetization occurs.

In the context of various embodiments, the term "disposed" may be interchangeably used with the terms "arranged" and/or "formed".

Figure 2A:
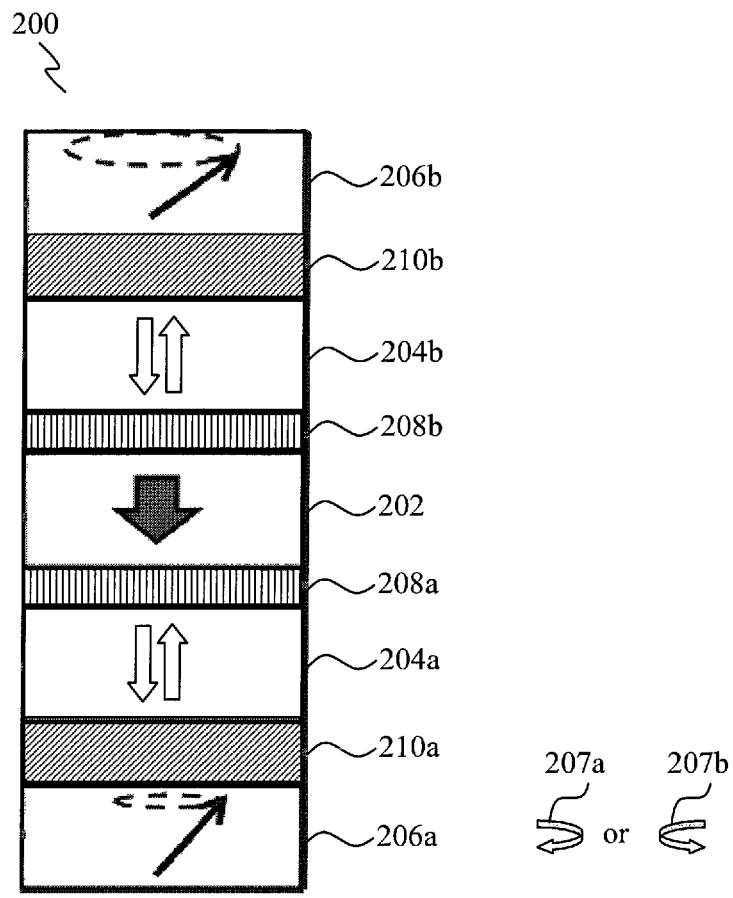
FIG. 2A shows a schematic cross-sectional view of a magnetoresistive device, according to various embodiments.

FIG. 2A shows a schematic cross-sectional view of a magnetoresistive device 200, according to various embodiments, illustrating a non-limiting example of a 2-bit spin transfer torque magnetoresistive random access memory (STT-MRAM), for implementation using the Frequency Selection Switching Scheme (FSSS) or the Oscillator Selection Switching Scheme (OSSS).

The magnetoresistive device 200 may be a giant magnetoresistive (GMR) device or a tunneling magnetoresistive (TMR) device, e.g. a spin transfer torque magnetic random access memory (STT-MRAM) with perpendicular anisotropy. The magnetoresistive device 200 has a stack structure, having for example a plurality of ferromagnetic layers.

The magnetoresistive device 200 includes a ferromagnetic hard layer 202 as a reference layer, two (2) ferromagnetic soft layers, e.g. a first ferromagnetic soft layer 204a and a second ferromagnetic soft layer 204b, and two (2) oscillating ferromagnetic structures, e.g. a first oscillating ferromagnetic structure 206a and a second oscillating ferromagnetic structure 206b, arranged one over the other. The ferromagnetic hard layer 202 may have a fixed magnetization orientation, the ferromagnetic soft layers 204a, 204b may have a variable magnetization orientation, i.e. the magnetization orientation is changeable or switchable between different orientations or states, while the oscillating ferromagnetic structures, 206a, 206b may have a magnetization orientation which may oscillate or precess in a direction in response to a current or a voltage applied across the magnetoresistive device 200.

The ferromagnetic hard layer 202, the first ferromagnetic soft layer 204a, the second ferromagnetic soft layer 204b, the first oscillating ferromagnetic structure 206a and the second oscillating ferromagnetic structure 206b have their magnetic easy axis (e.g. magnetization orientation or direction) aligned in a perpendicular direction (i.e. perpendicular anisotropy), for example in a direction at least substantially perpendicular to a plane defined by an interface, for example an interface between the first ferromagnetic soft layer 204a and the first oscillating ferromagnetic structure 206a or between the ferromagnetic hard layer 202 and the first ferromagnetic soft layer 204a.

As shown in FIG. 2A, the arrow shown within the ferromagnetic hard layer 202 illustrates the direction of magnetization orientation of the ferromagnetic hard layer 202. While the arrow is shown pointing in a downward direction, it should be appreciated that the arrow may be illustrated as pointing in an upward direction, such that a magnetization orientation in the opposite direction to that of the embodiment of FIG. 2A may be provided for the ferromagnetic hard layer 202.

The magnetization orientation or direction of each of the first ferromagnetic soft layer 204a and the second ferromagnetic soft layer 204b may be oriented parallel to and in the same direction (parallel state) as the magnetization orientation of the ferromagnetic hard layer 202, or oriented parallel to and in the opposite direction (anti-parallel state) as the magnetization orientation of the ferromagnetic hard layer 202. The respective arrows shown within the first ferromagnetic soft layer 204a and the second ferromagnetic soft layer 204b illustrate the two directions (upwards and downwards) of the magnetization orientation, such that the magnetization orientation of each of the first ferromagnetic soft layer 204a and the second ferromagnetic soft layer 204b may be in either of these two directions.

Furthermore, in various embodiments, the magnetization orientations or directions of the first oscillating ferromagnetic structure 206a and the second oscillating ferromagnetic structure 206b are oriented in an opposite direction with respect to the magnetization orientation of the ferromagnetic hard layer 202. For illustration purposes, each of the magnetization orientations or directions of the first oscillating ferromagnetic structure 206a, the second oscillating ferromagnetic structure 206b and the ferromagnetic hard layer 202, as represented by the respective arrows within the respective layers in FIG. 2A, may point in an upward direction or a downward direction.

The magnetization orientations of the first oscillating ferromagnetic structure 206a and the second oscillating ferromagnetic structure 206b may oscillate or precess in a direction, such as a cone direction or a direction resembling a cone, in response to a current or a voltage applied across the magnetoresistive device 200 so as to change the magnetization orientation of the corresponding first ferromagnetic soft layer 204a and second ferromagnetic soft layer 204b respectively, for example due to spin transfer torque. For illustration purposes, the magnetization orientations of the first oscillating ferromagnetic structure 206a and the second oscillating ferromagnetic structure 206b are shown as oscillating in a cone direction, which may occur during operation, or in-motion or oscillating mode (e.g. when a current or a voltage is applied across the magnetoresistive device 200). As illustrated in FIG. 2A, the cone direction may be a direction as represented by the arrow 207a (e.g. clockwise direction) or the arrow 207b (e.g. anti-clockwise direction).

In various embodiments, the magnetization orientations of the first oscillating ferromagnetic structure 206a and the second oscillating ferromagnetic structure 206b may oscillate or precess in the same or opposite directions. In various embodiments, the magnetization orientations of the first oscillating ferromagnetic structure 206a and the second oscillating ferromagnetic structure 206b may oscillate or precess at the same or different amplitudes.

In various embodiments, the first ferromagnetic soft layer 204a is arranged between the ferromagnetic hard layer 202 and the first oscillating ferromagnetic structure 206a, while the second ferromagnetic soft layer 204b is arranged between the ferromagnetic hard layer 202 and the second oscillating ferromagnetic structure 206b.

The magnetoresistive device 200 has a stack arrangement having different ferromagnetic layers in the order of the first oscillating ferromagnetic structure 206a, the first ferromagnetic soft layer 204a, the ferromagnetic hard layer 202, the second ferromagnetic soft layer 204b and the second oscillating ferromagnetic structure 206b. It should be appreciated that the positions of the first ferromagnetic soft layer 204a and the second ferromagnetic soft layer 204b may be interchangeable, and/or the positions of the first oscillating ferromagnetic structure 206a and the second oscillating ferromagnetic structure 206b may be interchangeable. The first oscillating ferromagnetic structure 206a, the first ferromagnetic soft layer 204a, the ferromagnetic hard layer 202, the second ferromagnetic soft layer 204b and the second oscillating ferromagnetic structure 206b may form part of a magnetic junction of the magnetoresistive device 200.

As shown in FIG. 2A, each of the first oscillating ferromagnetic structure 206a, the first ferromagnetic soft layer 204a, the ferromagnetic hard layer 202, the second ferromagnetic soft layer 204b and the second oscillating ferromagnetic structure 206b are separated from each other by a separating layer, for example a spacer layer.

The magnetoresistive device 200 includes a separating layer 208a arranged in between the ferromagnetic hard layer 202 and the first ferromagnetic soft layer 204a. The magnetoresistive device 200 further includes a separating layer 208b arranged in between the ferromagnetic hard layer 202 and the second ferromagnetic soft layer 204b.

Each of the separating layers 208a, 208b may be of a non-conductive and non-magnetic material (e.g. an insulator). For example, each of the separating layers 208a, 208b may include but not limited to one or more of magnesium oxide (MgO), aluminium oxide ($AlO_x$), or titanium oxide ($TiO_x$).

The magnetoresistive device 200 includes a separating layer 210a arranged in between the first oscillating ferromagnetic structure 206a and the first ferromagnetic soft layer 204a. The magnetoresistive device 200 further includes a separating layer 210b arranged in between the second ferromagnetic soft layer 204b and the second oscillating ferromagnetic structure 206b.

Each of the separating layers 210a, 210b may be of a conductive and non-magnetic material (e.g. a conductor). For example, each of the separating layers 210a, 210b may include but not limited to one or more of copper (Cu), silver (Ag), gold (Au), tantalum (Ta), chromium (Cr), palladium (Pd), platinum (Pt), iridium (Ir), rhodium (Rh) or ruthenium (Ru). The magnetoresistive device 200 may therefore be configured as a tunneling magnetoresistive (TMR) device.

However, it should be appreciated that the magnetoresistive device 200 may be configured as a giant magnetoresistive (GMR) device, with both the separating layers 208a, 208b of a conductive and non-magnetic material (e.g. a conductor), e.g. one or more of Cu, Ag, Au, Ta, Cr, Pd, Pt, Ir, Rh or Ru.

In addition, it should be appreciated that any one of or both separating layers 210a, 210b may be of a non-conductive and non-magnetic material (e.g. an insulator) including but not limited to one or more of magnesium oxide (MgO), aluminium oxide ($AlO_x$), or titanium oxide ($TiO_x$). The thickness of the insulating layer may be between about 0.3 nm and about 2.0 nm, e.g. between about 0.3 nm and about 1.5 nm, between about 0.3 nm and about 0.8 nm, between about 0.8 nm and about 2.0 nm, between about 0.8 nm and about 1.5 nm or between about 0.6 nm and about 1.2 nm.

While FIG. 2A illustrates a common ferromagnetic hard layer 202 shared by the first ferromagnetic soft layer 204a and the second ferromagnetic soft layer 204b, it should be appreciated that a respective corresponding ferromagnetic hard layer may be provided for each of the first ferromagnetic soft layer 204a and the second ferromagnetic soft layer 204b.

It should be appreciated that the magnetoresistive device 200 may have any stack structure or arrangement with any number of ferromagnetic layers or structures, and/or arranged in any configurations, as long as a ferromagnetic soft layer has a corresponding oscillating ferromagnetic structure arranged on one side of the ferromagnetic soft layer and a ferromagnetic hard layer arranged on the other side of the ferromagnetic soft layer, opposite to the oscillating ferromagnetic structure.

Figure 2B:
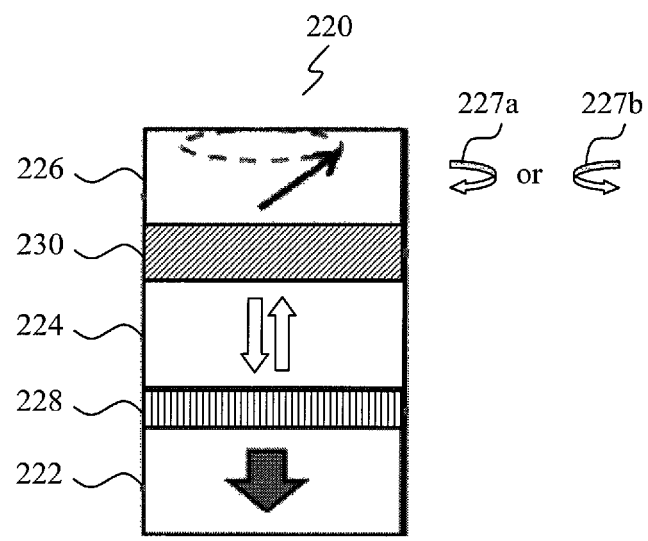
FIG. 2B shows a schematic cross-sectional view of a magnetoresistive device, according to various embodiments.

FIG. 2B shows a schematic cross-sectional view of a magnetoresistive device 220, according to various embodiments, illustrating a non-limiting example of a 1-bit spin transfer torque magnetoresistive random access memory (STT-MRAM), for implementation using the Frequency Selection Switching Scheme (FSSS) or the Oscillator Selection Switching Scheme (OSSS).

The magnetoresistive device 220 may be a giant magnetoresistive (GMR) device or a tunneling magnetoresistive (TMR) device, e.g. a spin transfer torque magnetic random access memory (STT-MRAM) with perpendicular anisotropy. The magnetoresistive device 220 has a stack structure, having for example a plurality of ferromagnetic layers.

The magnetoresistive device 220 includes a ferromagnetic hard layer 222 as a reference layer, a ferromagnetic soft layer 224, and an oscillating ferromagnetic structure 226, arranged one over the other. In various embodiments, the ferromagnetic soft layer 224 is arranged between the ferromagnetic hard layer 222 and the oscillating ferromagnetic structure 226.

The ferromagnetic hard layer 222 may have a fixed magnetization orientation, the ferromagnetic soft layer 224a may have a variable magnetization orientation, i.e. the magnetization orientation is changeable or switchable between different orientations or states, while the oscillating ferromagnetic structure 226 may have a magnetization orientation which may oscillate or precess in a direction in response to a current or a voltage applied across the magnetoresistive device 220.

The ferromagnetic hard layer 222, the ferromagnetic soft layer 224 and the oscillating ferromagnetic structure 226 have their magnetic easy axis (e.g. magnetization orientation or direction) aligned in a perpendicular direction (i.e. perpendicular anisotropy), for example in a direction at least substantially perpendicular to a plane defined by an interface, for example an interface between the ferromagnetic hard layer 222 and the ferromagnetic soft layer 224 or between the oscillating ferromagnetic structure 226 and the ferromagnetic soft layer 224.

As shown in FIG. 2B, the arrow shown within the ferromagnetic hard layer 222 illustrates the direction of magnetization orientation of the ferromagnetic hard layer 222. While the arrow is shown pointing in a downward direction, it should be appreciated that the arrow may be illustrated as pointing in an upward direction, such that a magnetization orientation in the opposite direction to that of the embodiment of FIG. 2B may be provided for the ferromagnetic hard layer 222.

The magnetization orientation or direction of the ferromagnetic soft layer 224 may be oriented parallel to and in the same direction (parallel state) as the magnetization orientation of the ferromagnetic hard layer 222, or oriented parallel to and in the opposite direction (anti-parallel state) as the magnetization orientation of the ferromagnetic hard layer 222. The respective arrows shown within the ferromagnetic soft layer 224 illustrate the two directions (upwards and downwards) of the magnetization orientation, such that the magnetization orientation of the ferromagnetic soft layer 224 may be in either of these two directions.

Furthermore, in various embodiments, the magnetization orientation of the oscillating ferromagnetic structure 226 is oriented in an opposite direction with respect to the magnetization orientation of the ferromagnetic hard layer 222. For illustration purposes, the magnetization orientations of the oscillating ferromagnetic structure 226 and the ferromagnetic hard layer 222, as represented by the respective arrows within the respective layers in FIG. 2B, may point in an upward direction or a downward direction.

The magnetization orientations of the oscillating ferromagnetic structure 226 may oscillate or precess in a direction, such as a cone direction or a direction resembling a cone, in response to a current or a voltage applied across the magnetoresistive device 220 so as to change the magnetization orientation of the ferromagnetic soft layer 224, for example due to spin transfer torque. For illustration purposes, the magnetization orientation of the oscillating ferromagnetic structure 226 is shown as oscillating in a cone direction, which may occur during operation, or in-motion or oscillating mode (e.g. when a current or a voltage is applied across the magnetoresistive device 220). As illustrated in FIG. 2B, the cone direction may be a direction as represented by the arrow 227a (e.g. clockwise direction) or the arrow 227b (e.g. anti-clockwise direction).

The magnetoresistive device 220 has a stack arrangement having different ferromagnetic layers in the order of the oscillating ferromagnetic structure 226, the ferromagnetic soft layer 224 and the ferromagnetic hard layer 222. It should be appreciated that the positions of the oscillating ferromagnetic structure 226 and the ferromagnetic hard layer 222 may be interchangeable. The oscillating ferromagnetic structure 226, the ferromagnetic soft layer 224 and the ferromagnetic hard layer 222 may form part of a magnetic junction of the magnetoresistive device 220.

As shown in FIG. 2B, each of the oscillating ferromagnetic structure 226, the ferromagnetic soft layer 224 and the ferromagnetic hard layer 222 are separated from each other by a separating layer, for example a spacer layer.

The magnetoresistive device 220 includes a separating layer 228 arranged in between the ferromagnetic hard layer 222 and the ferromagnetic soft layer 224. The separating layer 228 may be of a non-conductive and non-magnetic material (e.g. an insulator). For example, the separating layer 228 may include but not limited to one or more of magnesium oxide (MgO), aluminium oxide ($AlO_x$), or titanium oxide ($TiO_x$).

The magnetoresistive device 220 further includes a separating layer 230 arranged in between the oscillating ferromagnetic structure 226 and the ferromagnetic soft layer 224. The separating layer 230 may be of a conductive and non-magnetic material (e.g. a conductor). For example, the separating layer 230 may include but not limited to one or more of copper (Cu), silver (Ag), gold (Au), tantalum (Ta), chromium (Cr), palladium (Pd), platinum (Pt), iridium (Ir), rhodium (Rh) or ruthenium (Ru). The magnetoresistive device 220 may therefore be configured as a tunneling magnetoresistive (TMR) device.

However, it should be appreciated that the magnetoresistive device 220 may be configured as a giant magnetoresistive (GMR) device, with the separating layer 228 of a conductive and non-magnetic material (e.g. a conductor), e.g. one or more of Cu, Ag, Au, Ta, Cr, Pd, Pt, Ir, Rh or Ru.

It should be appreciated that any number of the stack arrangements illustrated in FIG. 2A and/or FIG. 2B may be arranged to provide a multi-bit per cell spin transfer torque magnetoresistive random access memory (STT-MRAM).

In the context of various embodiments of the magnetoresistive devices 200, 220, one or more of the first oscillating ferromagnetic structure 206a, the second oscillating ferromagnetic structure 206b and the oscillating ferromagnetic structure 226 may include one or more ferromagnetic materials, and/or one or more ferromagnetic layers. Each ferromagnetic layer may include at least one of iron (Fe), cobalt (Co) or nickel (Ni). In various embodiments, one or more of the ferromagnetic layers may include cobalt-iron-boron (CoFeB), a bilayer structure of cobalt-nickel (Co/Ni), or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt), iron-platinum (FePt) alloy, cobalt-platinum (CoPt) alloy, cobalt-iron (CoFe) and any combination thereof. For example, the ferromagnetic layer may include a bilayer or a multilayer of (Co/Ni), (Co/X), (CoFe/X) or (CoFeB/X). Any combination of cobalt-iron-boron (CoFeB), (Co/Ni), (Co/X) multilayer, (CoFe/X) multilayer and (CoFeB/X) multilayer may also be provided. As a non-limiting example, the ferromagnetic layer may include (CoFe/Pd)$_5$, of 5 layers of CoFe arranged alternately with 5 layers of Pd, i.e. (CoFe/Pd/CoFe/Pd/CoFe/Pd/CoFe/Pd/CoFe/Pd)

In various embodiments, the thickness of each ferromagnetic layer in the first oscillating ferromagnetic structure 206a, the second oscillating ferromagnetic structure 206b and the oscillating ferromagnetic structure 226 may be in a range of between about 0.2 nm and about 4 nm, for example between about 0.2 nm and about 2 nm, between about 0.2 nm and about 1 nm, between about 1 nm and about 4 nm, between about 2 nm and about 4 nm, or between about 1 nm and about 3 nm.

In various embodiments, where any of the first oscillating ferromagnetic structure 206a, the second oscillating ferromagnetic structure 206b and the oscillating ferromagnetic structure 226 has a multilayer structure, the multilayer structure may include any number of a bilayer structure, e.g. (CoFe/Pd), of 2 (e.g. (CoFe/Pd)$_2$) or more (e.g. 3, 4, 5, 6 or any higher number) bilayer structure. In other words, the bilayer structure, e.g. (CoFe/Pd), may be repeated twice or any higher number.

In the context of various embodiments of the magnetoresistive devices 200, 220, where any of the first oscillating ferromagnetic structure 206a, the second oscillating ferromagnetic structure 206b and the oscillating ferromagnetic structure 226 includes more than one ferromagnetic layer, e.g. 2, 3, 4, 5 or any higher number, one or more non-magnetic layer may be deposited or arranged between any two adjacent ferromagnetic layers. The non-magnetic layer may be ruthenium (Ru), rhodium (Rh), iridum (Ir), copper (Cu), silver (Ag), or chromium (Cr), with a thickness of between about 0.2 nm and about 3 nm, for example between about 0.2 nm and about 2 nm, between about 0.2 nm and about 1 nm, between about 1 nm and about 3 nm, or between about 0.5 nm and about 2 nm.

In embodiments where there are two or more oscillating ferromagnetic structures, the oscillating ferromagnetic structures may be of the same or different configurations and/or materials and/or number of layers and/or materials per layer and/or number of repeating bilayer structures. In various embodiments, where each of the two or more oscillating ferromagnetic structures includes a single ferromagnetic layer, the oscillating ferromagnetic structures may be of different materials.

In the context of various embodiments of the magnetoresistive devices 200, 220, the first oscillating ferromagnetic structure 206a, the second oscillating ferromagnetic structure 206b and the oscillating ferromagnetic structure 226 may assist the switching of the magnetization of the corresponding ferromagnetic soft layers 204a, 204b, 224, by Frequency Induced Spin Torque Switching (FISTS), which will be described later.

For embodiments of the Frequency Selection Switching Scheme (FSSS), the properties of the first ferromagnetic soft layer 204a, the second ferromagnetic soft layer 204b and the ferromagnetic soft layer 224, and its respective corresponding first oscillating ferromagnetic structure 206a, second oscillating ferromagnetic structure 206b and oscillating ferromagnetic structure 226 may be determined or chosen such that switching of each of the first ferromagnetic soft layer 204a, the second ferromagnetic soft layer 204b and the ferromagnetic soft layer 224 may be carried out only in a range of frequencies close to a resonance frequency of the respective ferromagnetic soft layer. This may allow each of the first ferromagnetic soft layer 204a, the second ferromagnetic soft layer 204b and the ferromagnetic soft layer 224 to switch at different frequencies independently, e.g. each ferromagnetic soft layer may be switched independently within a particular range of magnetization switching frequencies.

Figure 2C:
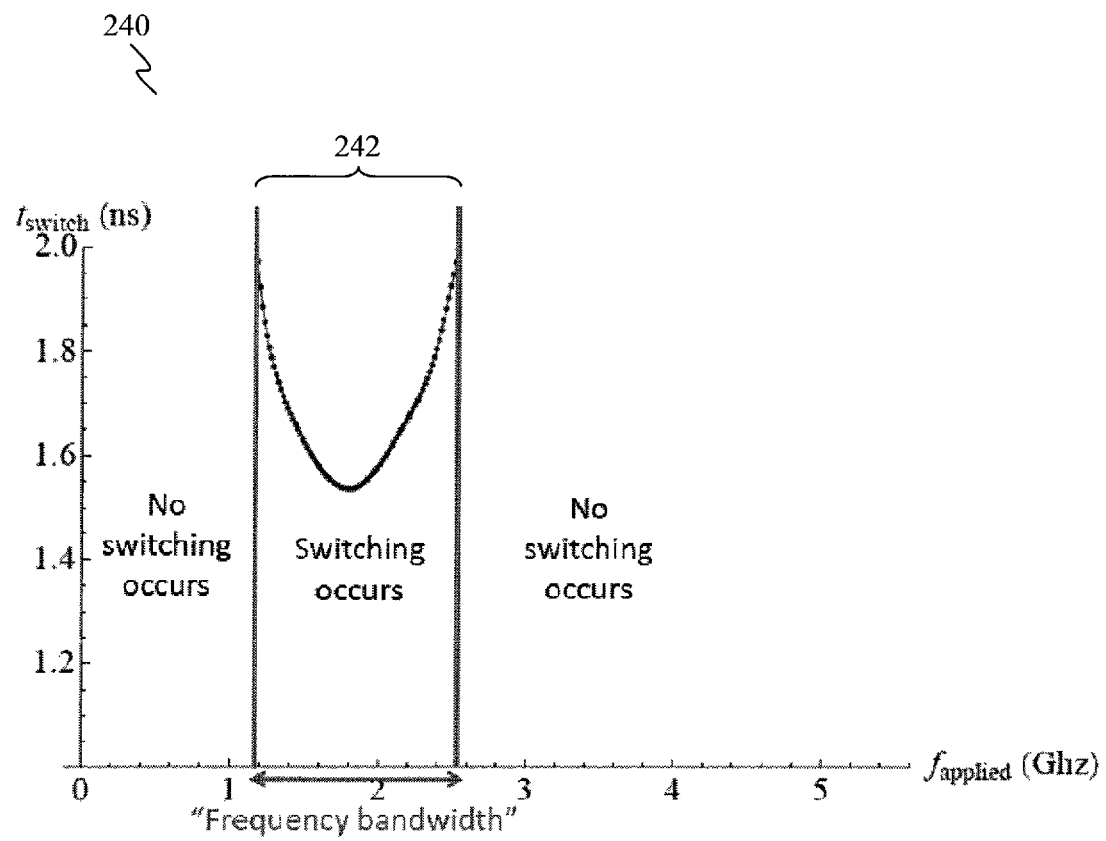
FIG. 2C shows a schematic diagram illustrating the concept of frequency bandwidth for various embodiments.

FIG. 2C shows a schematic diagram 240 illustrating the concept of frequency bandwidth 242 for various embodiments. The frequency bandwidth 242 may be defined as the range of frequencies where switching (e.g. a range of magnetization switching frequencies), for example of a ferromagnetic soft layer, occurs for a particular applied current density and pulse width (e.g. 2 ns).

For embodiments of the Oscillator Selection Switching Scheme (OSSS), the properties of the respective first oscillating ferromagnetic structure 206a, second oscillating ferromagnetic structure 206b and oscillating ferromagnetic structure 226 corresponding to each of the first ferromagnetic soft layer 204a, the second ferromagnetic soft layer 204b and the ferromagnetic soft layer 224 may be determined or chosen such that the first oscillating ferromagnetic structure 206a, the second oscillating ferromagnetic structure 206b and the oscillating ferromagnetic structure 226 have different critical current densities (or ranges of operating current amplitudes) at which oscillations are induced, so that FISTS is in effect for only one ferromagnetic soft layer for a particular applied current density. This may allow each of the first ferromagnetic soft layer 204a, the second ferromagnetic soft layer 204b and the ferromagnetic soft layer 224 to switch independently at different current densities, e.g. each ferromagnetic soft layer may be switched independently at a particular current density or a particular range of operating current amplitudes.

Non-limiting examples of an oscillating ferromagnetic structure are now described with reference to FIGS. 3A to 3D.

Figure 3A:
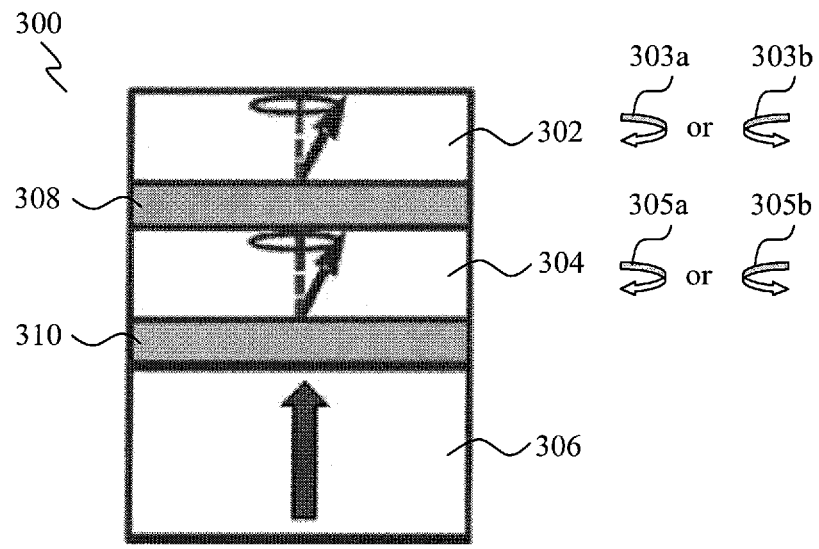
FIGS. 3A to 3D show respective schematic cross-sectional views of an oscillating ferromagnetic structure, according to various embodiments.

FIG. 3A shows a schematic cross-sectional view of an oscillating ferromagnetic structure 300, according to various embodiments, during operation, or in-motion or oscillating mode (e.g. when a current or a voltage is applied across the oscillating ferromagnetic structure 300). The oscillating ferromagnetic structure 300 includes a ferromagnetic layer 302 with a perpendicular anisotropy component, a ferromagnetic layer 304 with an in-plane anisotropy component (i.e. in an initial state or rest state, the magnetization orientation of the ferromagnetic layer 304 points in a left or right direction) and a ferromagnetic hard layer 306 with a perpendicular anisotropy component, the ferromagnetic layer 302, the ferromagnetic layer 304 and the ferromagnetic hard layer 306 arranged one over the other. In other words, the ferromagnetic layer 302 and the ferromagnetic hard layer 306 have respective magnetization orientations configured to orient in a direction at least substantially perpendicular to a plane defined by an interface, for example an interface between the ferromagnetic layer 302 and the ferromagnetic layer 304 or between the ferromagnetic layer 302 and the ferromagnetic hard layer 306. The ferromagnetic layer 304 has a magnetization orientation configured to orient in a direction at least substantially parallel to a plane defined by an interface, for example an interface between the ferromagnetic layer 302 and the ferromagnetic layer 304 or between the ferromagnetic layer 302 and the ferromagnetic hard layer 306. As a non-limiting example, FIG. 3A illustrates that the ferromagnetic layer 302 is arranged or stacked on top of the ferromagnetic layer 304, which in turn in arranged or stacked on top of the ferromagnetic hard layer 306.

As shown in FIG. 3A, during operation or during in-motion or oscillating mode, the respective magnetization orientations of the ferromagnetic layer 302 and the ferromagnetic layer 304 may oscillate or precess in a direction, such as a cone direction or a direction resembling a cone, in response to a current or a voltage applied across the oscillating ferromagnetic structure 300 so as to change the magnetization orientation of a corresponding ferromagnetic soft layer, for example due to spin transfer torque. As a non-limiting example, with reference to FIGS. 2A and 3A, the structure of the first oscillating ferromagnetic structure 206a may be that of the oscillating ferromagnetic structure 300. Where the first oscillating ferromagnetic structure 206a is configured such that the magnetization orientation of the first oscillating ferromagnetic structure 206a oscillates in a direction, e.g. the cone direction as represented by the arrow 207a (e.g. clockwise direction), the magnetization orientation of the ferromagnetic layer 302 oscillates in a similar clockwise direction, as represented by the arrow 303a, while the magnetization orientation of the ferromagnetic layer 304 may oscillate in a clockwise direction or anti-clockwise direction, as represented respectively by the arrows 305a and 305b. Where the first oscillating ferromagnetic structure 206a is configured such that the magnetization orientation of the first oscillating ferromagnetic structure 206a oscillates in a direction, e.g. the cone direction as represented by the arrow 207b (e.g. anti-clockwise direction), the magnetization orientation of the ferromagnetic layer 302 oscillate in a similar anti-clockwise direction, as represented by the arrow 303b, while the magnetization orientation of the ferromagnetic layer 304 may oscillate in a clockwise direction or anti-clockwise direction, as represented respectively by the arrows 305a and 305b. While the ferromagnetic layer 304 has an in-plane anisotropy component in the initial state or rest state, the magnetization orientation of the ferromagnetic layer 304 may be configured to oscillate or precess in the direction 305a or 305b (similar to directions 303a or 303b for the ferromagnetic layer 302 having a perpendicular anisotropy component) due to the effect of the ferromagnetic hard layer 306. The electrons acquire polarization in the polarization direction of the ferromagnetic hard layer 306, and the spin torque from these electrons act on the ferromagnetic layer 304. Due to the in-plane anisotropy of the ferromagnetic layer 304, the ferromagnetic layer 304 may respond to the spin torque in such a way that it may oscillate or precess in a cone direction (e.g. 305a or 305b) whose axis is perpendicular to the plane by an interface, for example an interface between the ferromagnetic layer 302 and the ferromagnetic layer 304 or between the ferromagnetic layer 302 and the ferromagnetic hard layer 306, similar to that for the ferromagnetic layer 302.

In various embodiments, the ferromagnetic layer 302 and the ferromagnetic layer 304 may be 'softer' (i.e. ferromagnetically softer) than the ferromagnetic hard layer 306. In various embodiments, the ferromagnetic layer 302 and the ferromagnetic layer 304 may or may not be 'softer' (i.e. ferromagnetically softer) than the ferromagnetic soft layers (e.g. 204a, 204b, 224).

The oscillating ferromagnetic structure 300 further includes a separating layer 308 arranged in between the ferromagnetic layer 302 and the ferromagnetic layer 304. The oscillating ferromagnetic structure 300 further includes a separating layer 310 arranged in between the ferromagnetic layer 304 and the ferromagnetic hard layer 306.

In various embodiments, each of the separating layers 308, 310 may be of a conductive and non-magnetic material (e.g. Cu, Ag or Au). In various embodiments, each of the separating layers 308, 310 may have a thickness of at least 1.5 nm, for example a thickness of between about 1.5 nm and 20 nm, e.g. between about 1.5 nm and 10 nm, between about 1.5 nm and 5 nm, between about 5 nm and 20 nm or between about 5 nm and 10 nm.

In various embodiments, each of the ferromagnetic layer 302 and the ferromagnetic layer 304 may include a material, including but not limited to cobalt (Co), cobalt-iron (CoFe), cobalt-iron-boron (CoFeB) or any combinations thereof.

In various embodiments, each of the ferromagnetic layer 302 and the ferromagnetic layer 304 may have a thickness in a range of between about 0.5 nm and about 4 nm, for example between about 0.5 nm and about 2 nm, between about 0.5 nm and about 1 nm or between about 1 nm and about 4 nm.

In various embodiments, the ferromagnetic hard layer 306 may include a material having at least one of iron (Fe), cobalt (Co) and nickel (Ni) elements, for example cobalt-iron-boron (CoFeB), (Co/Ni) multilayer, (Co/X) multilayer, (CoFe/X) multilayer, (CoFeB/X) multilayer where X is palladium (Pd) and/or platinum (Pt). Any combination of cobalt-iron-boron (CoFeB), (Co/Ni) multilayer, (Co/X) multilayer, (CoFe/X) multilayer and (CoFeB/X) multilayer may also be provided. The (Co/X) multilayer, the (CoFe/X) multilayer and the (CoFeB/X) multilayer may include a plurality of a bilayer structure having a first layer of material (Co, CoFe and CoFeB respectively) and a second layer of Pd and/or Pt. As a non-limiting example, the ferromagnetic hard layer 306 may include $(CoFe/Pd)_5$, of 5 layers of CoFe arranged alternately with 5 layers of Pd, i.e. (CoFe/Pd/CoFe/Pd/CoFe/Pd/CoFe/Pd/CoFe/Pd).

In various embodiments, the ferromagnetic hard layer 306 may have a thickness of between about 3 nm and about 50 nm, e.g. between about 3 nm and about 20 nm, between about 3 nm and about 10 nm, between about 10 nm and about 50 nm, between about 30 nm and about 50 nm or between about 5 nm and about 20 nm.

While FIG. 3A illustrates that the ferromagnetic hard layer 306 is arranged beneath the ferromagnetic layer 302 and the ferromagnetic layer 304, it should be appreciated that other arrangements of the ferromagnetic layer 302, the ferromagnetic layer 304 and the ferromagnetic hard layer 306 may be possible.

Figure 3B:
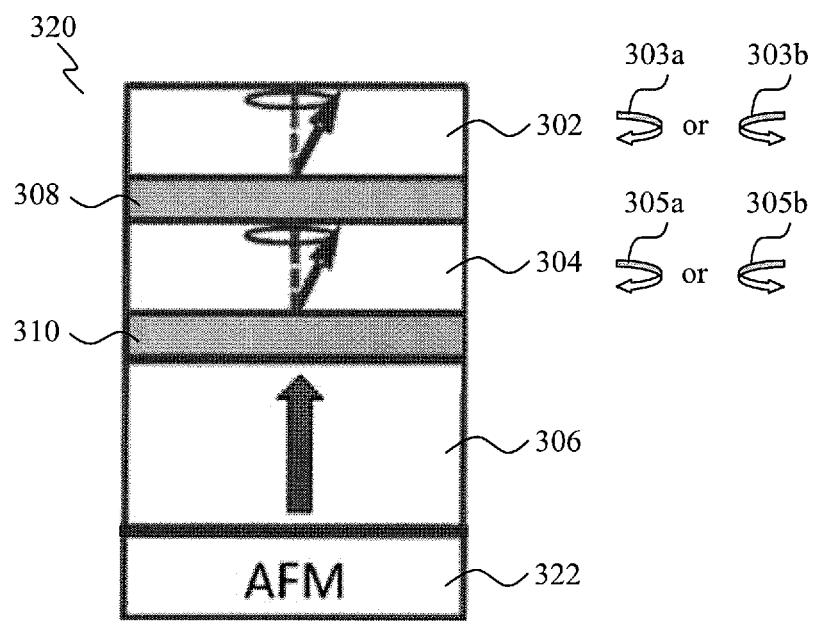

FIG. 3B shows a schematic cross-sectional view of an oscillating ferromagnetic structure 320, according to various embodiments. The oscillating ferromagnetic structure 320 includes a ferromagnetic layer 302 with a perpendicular anisotropy component, a ferromagnetic layer 304 with an in-plane anisotropy component and a ferromagnetic hard layer 306 with a perpendicular anisotropy component, the ferromagnetic layer 302, the ferromagnetic layer 304 and the ferromagnetic hard layer 306 arranged one over the other. The ferromagnetic layer 302, the ferromagnetic layer 304 and the ferromagnetic hard layer 306 may be as described in the context of the embodiments of FIG. 3A.

The oscillating ferromagnetic structure 320 further includes a separating layer 308 arranged in between the ferromagnetic layer 302 and the ferromagnetic layer 304. The oscillating ferromagnetic layer 300 further includes a separating layer 310 arranged in between the ferromagnetic layer 304 and the ferromagnetic hard layer 306. The separating layers 308, 310 may be as described in the context of the embodiments of FIG. 3A.

The oscillating ferromagnetic structure 320 may further include an antiferromagnetic (AFM) layer 322, where the ferromagnetic hard layer 306 may be arranged over or stacked on top of the antiferromagnetic layer 322, which pins the magnetization of the ferromagnetic hard layer 306.

In various embodiments, the antiferromagnetic layer 322 may include a material of X-manganese or X-Y-manganese, wherein each of X and Y may be platinum (Pt), palladium (Pd), iridium (Ir), rhodium (Rh) or ruthenium (Ru).

In various embodiments, the antiferromagnetic layer 322 may have a thickness in a range of between about 5 nm and about 20 nm, for example between about 5 nm and about 15 nm, between about 5 nm and about 10 nm or between about 10 nm and about 20 nm.

Figure 3C:
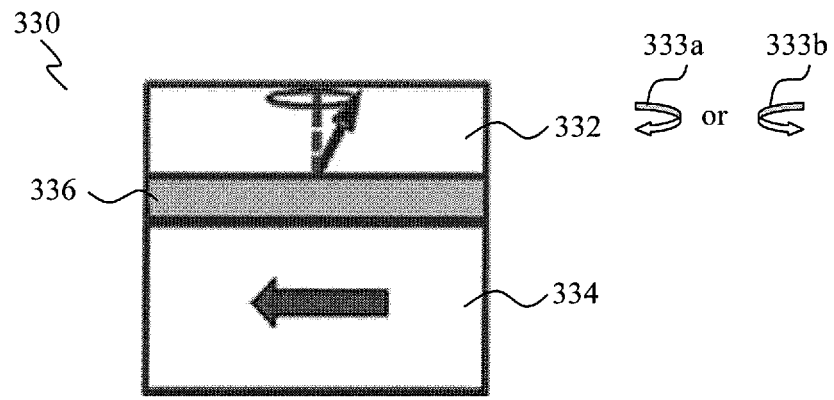

FIG. 3C shows a schematic cross-sectional view of an oscillating ferromagnetic structure 330, according to various embodiments, during operation, or in-motion or oscillating mode (e.g. when a current or a voltage is applied across the oscillating ferromagnetic structure 330). The oscillating ferromagnetic structure 330 includes a ferromagnetic layer 332 with a perpendicular anisotropy component and a ferromagnetic hard layer 334 with an in-plane anisotropy component, the ferromagnetic layer 332 and the ferromagnetic hard layer 334 arranged one over the other. In other words, the ferromagnetic layer 332 has a magnetization orientation configured to orient in a direction at least substantially perpendicular to a plane defined by an interface, for example an interface between the ferromagnetic layer 332 and the ferromagnetic hard layer 334. The ferromagnetic hard layer 334 has a magnetization orientation configured to orient in a direction at least substantially parallel to a plane defined by an interface, for example an interface between the ferromagnetic layer 332 and the ferromagnetic hard layer 334. As a non-limiting example, FIG. 3C illustrates that the ferromagnetic layer 332 is arranged or stacked on top of the ferromagnetic hard layer 334.

As shown in FIG. 3C, during operation or during in-motion or oscillating mode, the magnetization orientation of the ferromagnetic layer 332 may oscillate or precess in a direction, such as a cone direction or a direction resembling a cone, in response to a current or a voltage applied across the oscillating ferromagnetic structure 330 so as to change the magnetization orientation of a corresponding ferromagnetic soft layer, for example due to spin transfer torque. As a non-limiting example, with reference to FIGS. 2A and 3C, the structure of the first oscillating ferromagnetic structure 206a may be that of the oscillating ferromagnetic structure 330. Where the first oscillating ferromagnetic structure 206a is configured such that the magnetization orientation of the first oscillating ferromagnetic structure 206a oscillates in a direction, e.g. the cone direction as represented by the arrow 207a (e.g. clockwise direction), the magnetization orientation of the ferromagnetic layer 332 oscillates in a similar clockwise direction, as represented by the arrow 333a. Where the first oscillating ferromagnetic structure 206a is configured such that the magnetization orientation of the first oscillating ferromagnetic structure 206a oscillates in a direction, e.g. the cone direction as represented by the arrow 207b (e.g. anti-clockwise direction), the magnetization orientation of the ferromagnetic layer 332 oscillates in a similar anti-clockwise direction, as represented by the arrow 333b. In various embodiments, the direction of the in-plane anisotropy (e.g. in the left or right direction) of the ferromagnetic hard layer 334 may affect the direction of the oscillation of the ferromagnetic layer 332 (e.g. clockwise direction 333a or anti-clockwise direction 333b).

In various embodiments, the ferromagnetic layer 332 may be 'softer' (i.e. ferromagnetically softer) than the ferromagnetic hard layer 334. In various embodiments, the ferromagnetic layer 332 may or may not be 'softer' (i.e. ferromagnetically softer) than the ferromagnetic soft layers (e.g. 204a, 204b, 224).

The oscillating ferromagnetic structure 330 further includes a separating layer 336 arranged in between the ferromagnetic layer 332 and the ferromagnetic hard layer 334. In various embodiments, the separating layer 336 may be of a conductive and non-magnetic material (e.g. Cu, Ag or Au). In various embodiments, the separating layer 336 may have a thickness of at least 1.5 nm, for example a thickness of between about 1.5 nm and 20 nm, e.g. between about 1.5 nm and 10 nm, between about 1.5 nm and 5 nm, between about 5 nm and 20 nm or between about 5 nm and 10 nm.

In various embodiments, the ferromagnetic layer 332 may include a material having at least one of iron (Fe), cobalt (Co) and nickel (Ni) elements, for example cobalt-iron-boron (CoFeB), (Co/Ni) multilayer, (Co/X) multilayer, (CoFe/X) multilayer, (CoFeB/X) multilayer where X is palladium (Pd) and/or platinum (Pt). Any combination of cobalt-iron-boron (CoFeB), (Co/X) multilayer, (Co/Ni) multilayer, (CoFe/X) multilayer and (CoFeB/X) multilayer may also be provided. The (Co/X) multilayer, the (CoFe/X) multilayer and the (CoFeB/X) multilayer may include a plurality of a bilayer structure having a first layer of material (Co, CoFe and CoFeB respectively) and a second layer of Pd and/or Pt. As a non-limiting example, the ferromagnetic layer 332 may include (CoFe/Pd)$_5$, of 5 layers of CoFe arranged alternately with 5 layers of Pd, i.e. (CoFe/Pd/CoFe/Pd/CoFe/Pd/CoFe/Pd/CoFe/Pd).

In various embodiments, the ferromagnetic layer 332 may have a thickness in a range of between about 0.3 nm and about 4 nm, for example between about 0.3 nm and about 2 nm, between about 0.3 nm and about 1 nm or between about 1 nm and about 4 nm.

In various embodiments, the ferromagnetic hard layer 334 may be a single ferromagnetic layer or a synthetic antiferromagnetic layer (SAF). In various embodiments, the ferromagnetic hard layer 334 may include a material, including but not limited to cobalt (Co), cobalt-iron (CoFe), cobalt-iron-boron (CoFeB) or any combinations thereof.

In embodiments where the ferromagnetic hard layer 334 may be a synthetic antifferomagnetic layer (SAF), the SAF may include two antiferromagnetically coupled ferromagnetic layers, pinned by an antiferromagnetic layer. A metal separating layer, for example a conductive and non-magnetic separating layer (e.g. ruthenium (Ru)) may be sandwiched in between the two antiferromagnetically coupled ferromagnetic layers. As a non-limiting example, the synthetic antiferromagnetic layer may have a structure or arrangement having two ferromagnetic layers, with a metal separating layer having Ruderman-Kittel-Kasuya-Yosida (RKKY) coupling, such as but not limited to ruthenium (Ru), sandwiched in between the two ferromagnetic layers. One of the ferromagnetic layers may be a reference layer while the other ferromagnetic layer is a pinned layer, and in contact with an antiferromagnetic layer (e.g. including a material including X-manganese or X-Y-manganese, wherein each of X and Y is selected from the group consisting of platinum (Pt), palladium (Pd), iridium (Ir), rhodium (Rh) and ruthenium (Ru)). By employing the metal separating layer with an appropriate thickness, the magnetization orientations of the two ferromagnetic layers, may be anti-aligned (i.e. the layers may be antiferromagnetically coupled). In various embodiments, the SAF may pin the reference layer and may reduce stray magnetic field that may act on the ferromagnetic soft layer (e.g. 204a, 204b, 224).

In various embodiments, the ferromagnetic hard layer 334 may have a thickness in a range of between about 0.5 nm and about 4 nm, for example between about 0.5 nm and about 2 nm, between about 0.5 nm and about 1 nm or between about 1 nm and about 4 nm.

Figure 3D:
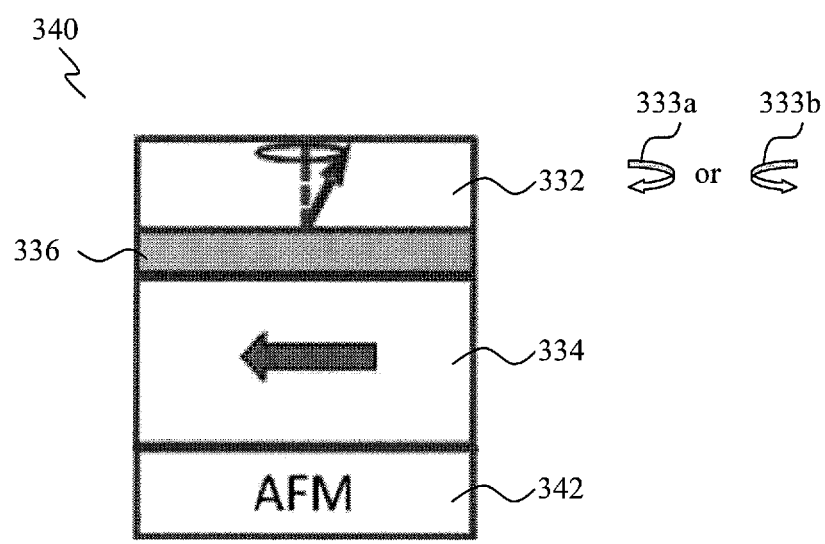

FIG. 3D shows a schematic cross-sectional view of an oscillating ferromagnetic structure 340, according to various embodiments. The oscillating ferromagnetic structure 340 includes a ferromagnetic layer 332 with a perpendicular anisotropy component and a ferromagnetic hard layer 334 with an in-plane anisotropy component, the ferromagnetic layer 332 and the ferromagnetic hard layer 334 arranged one over the other. The ferromagnetic layer 332 and the ferromagnetic hard layer 334 may be as described in the context of the embodiments of FIG. 3C.

The oscillating ferromagnetic structure 340 further includes a separating layer 336 arranged in between the ferromagnetic layer 332 and the ferromagnetic hard layer 334. The separating layer 336 may be as described in the context of the embodiments of FIG. 3C.

The oscillating ferromagnetic structure 340 may further include an antiferromagnetic layer 342, where the ferromagnetic hard layer 334 may be arranged over or stacked on top of the antiferromagnetic layer 342, which pins the magnetization of the ferromagnetic hard layer 334.

In various embodiments, the antiferromagnetic layer 342 may include a material of X-manganese or X-Y-manganese, wherein each of X and Y may be platinum (Pt), palladium (Pd), iridium (Ir), rhodium (Rh) or ruthenium (Ru).

In various embodiments, the antiferromagnetic layer 342 may have a thickness in a range of between about 5 nm and about 20 nm, for example between about 5 nm and about 15 nm, between about 5 nm and about 10 nm or between about 10 nm and about 20 nm.

In various embodiments, the physics of the switching process lies in the spin transfer from a polarized electric current to a ferromagnetic layer, and the spin from the polarized current may exert a "torque" which acts to reverse the magnetization of the ferromagnetic layer. The mechanism of the spin torque transfer may be governed by the Slonczewski spin torque term or other symmetric/asymmetric factor torque terms.

As the switching time may be strongly correlated to the magnitude of the spin torque, it would be desirable to increase the average spin torque magnitude during the magnetization reversal process, and the magnetoresistive device of various embodiments may achieve this effect in two ways. Firstly, the incorporation of one or more oscillating ferromagnetic structures (e.g. 206a, 206b, 226) act as another source of spin torque, in addition to the ferromagnetic hard layer (e.g. 202, 222). Secondly, the oscillating nature of the oscillating ferromagnetic structures may increase the average angle between the magnetization vectors or orientations of the oscillating ferromagnetic structures and the ferromagnetic soft layers (e.g. 204a, 204b, 224), as compared to the use of a static polarizer. The oscillating ferromagnetic structures may provide the required oscillating polarizer dynamics which may assist in the spin torque switching, for example in perpendicular anisotropic magnetoresistive devices.

Figure 4:
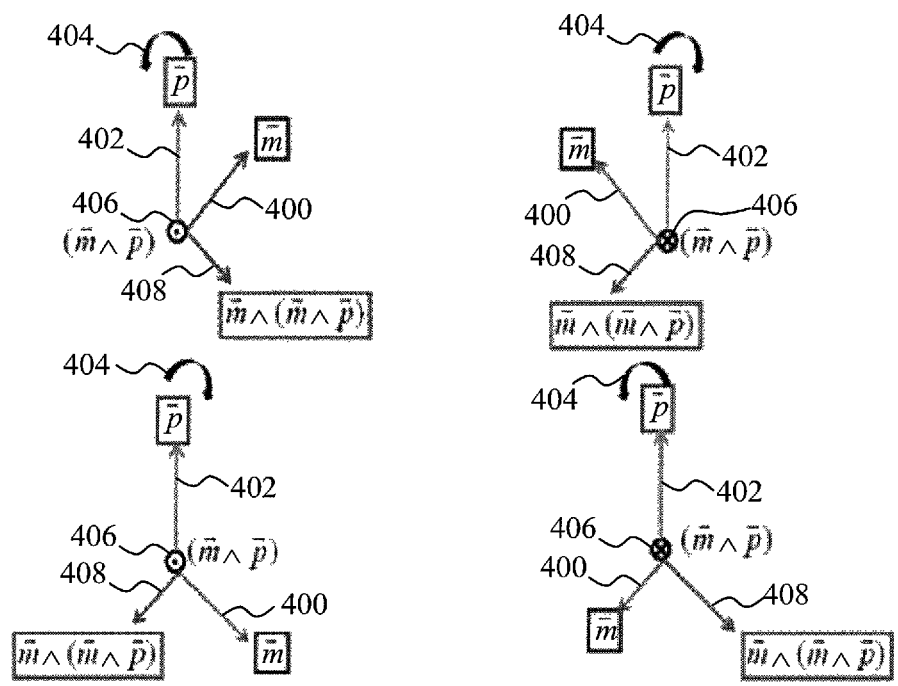
FIG. 4 shows different configurations of magnetization and polarization during a switching process.

FIG. 4 shows different configurations of magnetization and polarization during the switching process. As shown by the configurations of FIG. 4 of magnetization vector $\vec{m}$, as represented by the arrow 400, of a ferromagnetic soft layer (free layer) (e.g. layer 206a, 206b, 226) with respect to the vector $\vec{P}$, as represented by the arrow 402, of a polarizer (e.g. layers 202, 222), the polarization $\vec{P}$ needs to oscillate in order to increase the spin torque magnitude. The arrow as represented by 404 shows the direction the polarizer should move in order to increase the spin torque magnitude (i.e. the arrow 404 indicates the oscillation of the polarization vector $\vec{P}$ 402. The circle as represented by 406 shows the result of the vector which is the wedge product of the magnetization vector $\vec{m}$ 400 and the polarization vector $\vec{P}$ 402 (i.e. $\vec{m} \wedge \vec{P}$). The vector 406 is perpendicular to both the magnetization vector $\vec{m}$ 400 and the polarization vector $\vec{P}$ 402. The circle 406 including a dot in the centre represents a direction pointing out of the page, while the circle 406 including a cross within the circle 406 represents a direction pointing into the page. The arrow as represented by 408 shows the result of the operation ($\vec{m} \wedge (\vec{m} \wedge \vec{P})$). The symbol "$\wedge$" represents the wedge product of vectors.

The polarizer or polarization direction 402 denotes the spin polarization of the electrons acquired from passing through a preceding layer of a free layer or a ferromagnetic soft layer, or from back scattering from a succeeding layer of a free layer or a ferromagnetic soft layer, when considered from the perspective of the path of flow of electrons. In the scheme of Frequency-Induced Spin Torque Switching (FISTS) as described below, the polarization may be due to, but not limited to, the oscillating ferromagnetic structure (e.g. 206a, 206b, 226).

In various embodiments, by applying the appropriate oscillating frequency to the polarizer so that the angle between $\vec{m}$ 400 and $\vec{P}$ 402 may be optimized in the switching process, increased switching speed may be achieved, while reducing the current asymmetry of the P→AP and AP→P processes. This scheme may be referred to as Frequency-Induced Spin Torque Switching (FISTS), and which forms the basis for the magnetoresistive devices of various embodiments, for example as that illustrated in FIG. 2A, where the first oscillating ferromagnetic structure 206a and the second oscillating ferromagnetic structure 206b may provide the required oscillating polarizer dynamics which may assist in the spin torque switching, for example in perpendicular anisotropic magnetoresistive devices. For implementing FISTS, it is desirable that the first oscillating ferromagnetic structure 206a and the second oscillating ferromagnetic structure 206b oscillate or precess with a fixed direction (e.g. a fixed cone direction) for both positive and negative writing currents, so that the spin torque induced, generated or provided by the first oscillating ferromagnetic structure 206a and the second oscillating ferromagnetic structure 206b may aid in the switching of both P→AP and AP→P for the ferromagnetic soft layers.

The switching performance of the magnetoresistive devices of various embodiments may be investigated using macrospin simulations, based on the Frequency-Induced Spin Torque Switching (FISTS) scheme. One or more of the following parameters may be used for the macrospin simulation:

γ: gyromagnetic ratio=$1.76 \times 10^{11} T^{-1} s^{-1}$ ($1.76 \times 10^7 Oe^{-1} s^{-1}$)

$M_s$: saturation magnetization=$0.7 \times 10^6$ A/m (700 emu/cm$^3$)

α: Gilbert damping constant=0.01 t: thickness=2 nm $P_{ref}$: Polarizer (or reference layer) polarization factor=0.4

$P_{osc}$: Oscillator (or oscillating ferromagnetic structure) polarization factor=0.4

$H_k$: Free layer (or ferromagnetic soft layer) perpendicular anisotropic field=1 T It should be appreciated that in some measurements, one or more of the above-mentioned parameters may be varied.

The results for magnetoresistive devices based on the Frequency Selection Switching Scheme (FSSS) will now be described by way of the following non-limiting examples.

Figure 5:
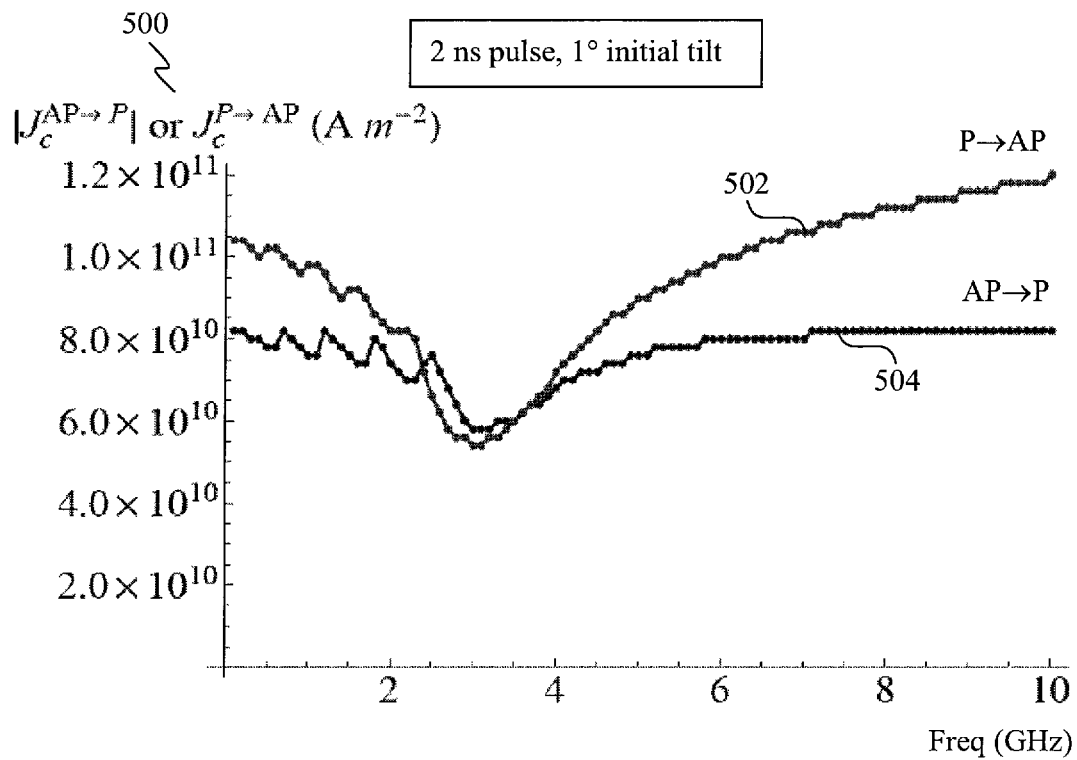
FIG. 5 shows a plot of macrospin simulation results of the critical current for P→AP and AP→P respectively when a 3 GHz oscillation is applied, according to various embodiments.

FIG. 5 shows a plot 500 of macrospin simulation results of the critical current for P→AP (denoted by 502) and AP→P (denoted by 504) respectively when a 3 GHz oscillation is applied, according to various embodiments. The ferromagnetic soft layer is initially set to have a very small tilt of about 1° from the perpendicular axis. As shown in FIG. 5, there is a reduction in the critical current, $J_C$, when a 3 GHz oscillation is applied, for both $J_C^{P \rightarrow AP}$ and $|J_C^{AP \rightarrow P}|$. In addition, there is a sharp reduction of switching current asymmetry when the additional polarizer (e.g. oscillating ferromagnetic structure) is oscillating close to resonance frequency. In the context of various embodiments, the resonance frequency refers to the oscillating frequency of the oscillating ferromagnetic structure at which the corresponding ferromagnetic soft layer may switch with the smallest critical current for a given pulse length and amplitude, or equivalently may switch in the fastest time for a given current pulse time width and amplitude. In various embodiments, the resonance frequency may be but not limited to 3 GHz. The frequency of 3 GHz may also represent the optimum magnetization switching frequency of the corresponding ferromagnetic soft layer, which may be similar to the resonance frequency of the ferromagnetic soft layer.

As illustrated in FIG. 5, the oscillation frequency may be tuned or selected so that the ferromagnetic soft layer may switch optimally at its resonance frequency for both P→AP 502 and AP→P 504 via FISTS. Therefore, through selection of the frequency of the respective oscillation ferromagnetic structures, the respective corresponding ferromagnetic soft layers may be switched independently. Such a Frequency Selection Switching Scheme (FSSS) may help to address any related overwriting issue that may occur in multi-bit per cell STT-MRAM.

Figure 6:
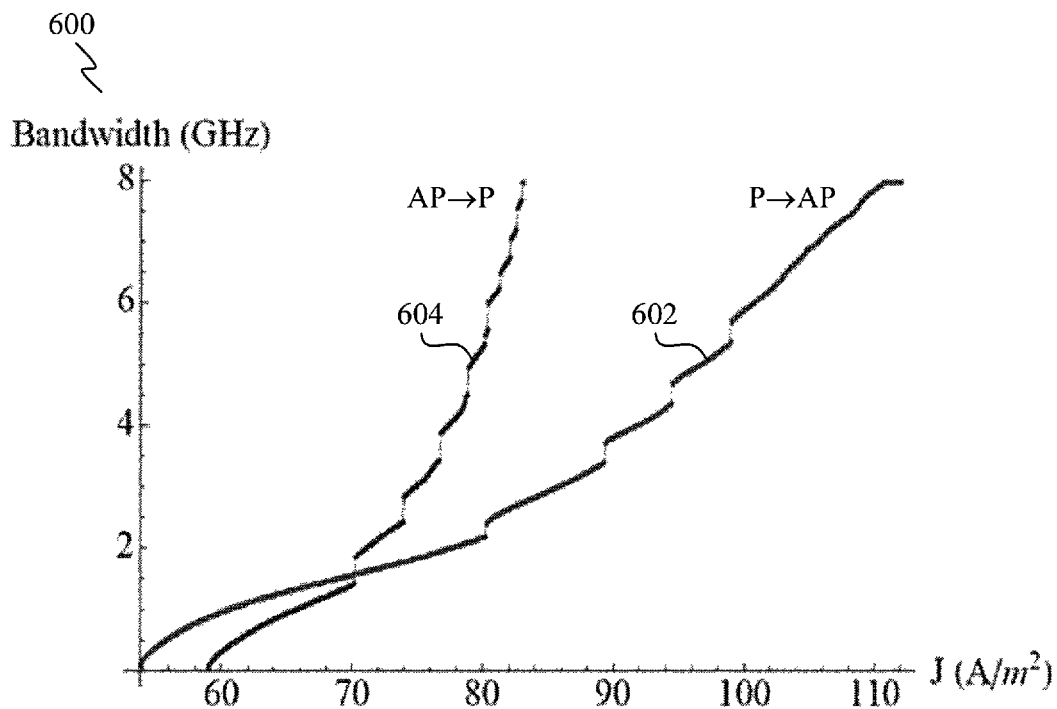
FIG. 6 shows a plot of macrospin simulation results of the relationship between the frequency bandwidth and the applied current density for P→AP and AP→P switchings, according to various embodiments.

For the Frequency Selection Switching Scheme (FSSS) to be employed for multi-bit per cell STT-MRAM, the frequency bandwidth should be reasonably narrow so that the selection of the frequency of the respective oscillation ferromagnetic structures for switching the corresponding ferromagnetic soft layers may be optimal. FIG. 6 shows a plot 600 of macrospin simulation results of the relationship between the frequency bandwidth and the applied current density for P→AP (denoted by 602) and AP→P (denoted by 604) switchings, according to various embodiments, in a single magnetoresistive (e.g. GMR or TMR) device. FIG. 6 shows that by changing the applied current density, it may be possible to control the frequency bandwidth for both P→AP 602 and AP→P 604 switchings.

In various embodiments, besides controlling the frequency bandwidth, it is also possible to adjust the resonance frequency of the ferromagnetic soft layer over a wide range. This may be helpful for magnetoresistive devices with a plurality of ferromagnetic soft layers, where individual ferromagnetic soft layers may be switched at different frequencies.

Figure 7:
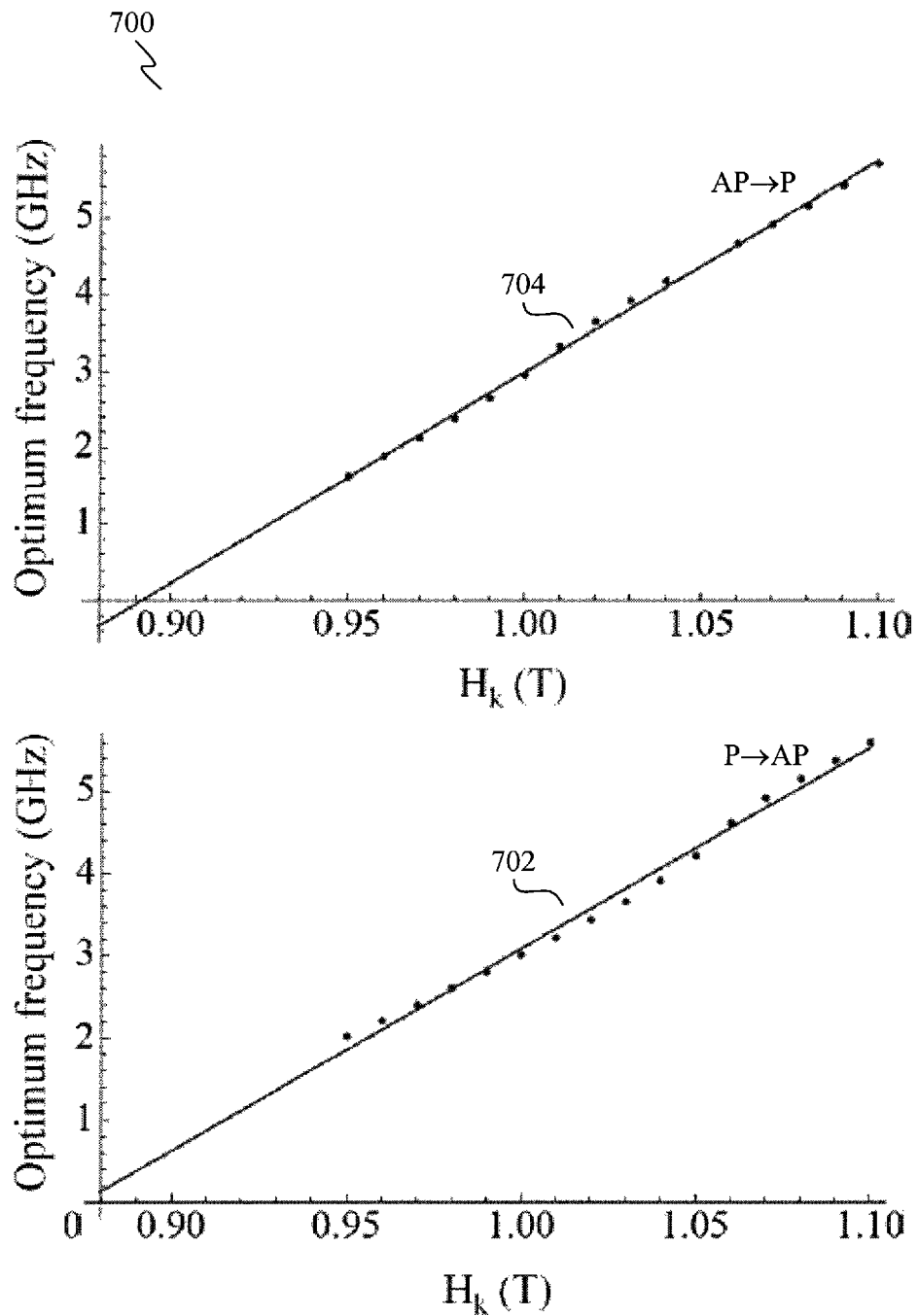
FIG. 7 shows a plot of macrospin simulation results of the relationship between the optimum magnetization switching frequency and the perpendicular anisotropy field for P→AP and AP→P switchings, according to various embodiments.

FIG. 7 shows a plot 700 of macrospin simulation results of the relationship between the optimum magnetization switching frequency, where switching occurs at the lowest current amplitude, and the perpendicular anisotropy field, $H_k$, for P→AP (denoted by 702) and AP→P (denoted by 704) switchings, according to various embodiments. $H_k$ has been varied from 0.95 T to 1.10 T, with an applied constant current density, J, of approximately $1.0 \times 10^7$ A/cm$^2$, with a pulse width of about 2 ns.

As shown in FIG. 7, the optimum magnetization switching frequency has an at least substantially linear dependence on the perpendicular magnetic anisotropy field, $H_k$, for both P→AP 702 and AP→P 704 switchings. The results indicate that by having different values of $H_k$ for different ferromagnetic soft layers, it may be possible to switch their magnetizations at different frequencies.

In various embodiments, it may also be possible to adjust the optimum magnetization switching frequency by changing the saturation magnetization, $M_s$, of the oscillating ferromagnetic structure and/or thickness, t, of the oscillating ferromagnetic structure.

Figure 8:
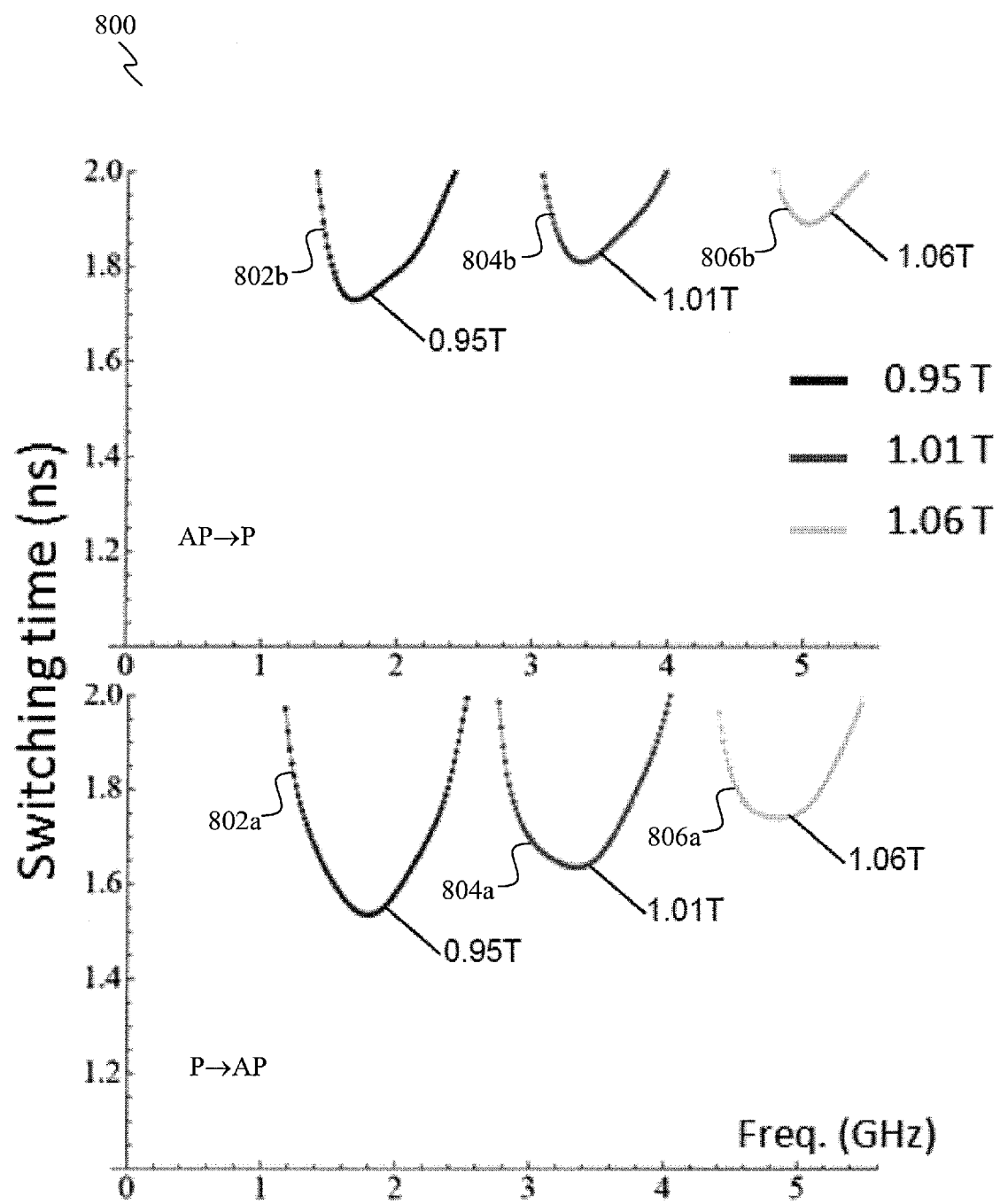
FIG. 8 shows a plot of macrospin simulation results of the relationship between the switching time and the applied oscillation frequency for P→AP and AP→P switchings for different perpendicular anisotropy fields, according to various embodiments.

In order to show the feasibility of using a selective frequency to switch different ferromagnetic soft layers, $H_k$ may be varied while fixing all other parameters. FIG. 8 shows a plot 800 of macrospin simulation results of the relationship between the switching time and the applied oscillation frequency for P→AP and AP→P switchings for different perpendicular anisotropy fields, $H_k$, according to various embodiments. The applied constant current density, J, is approximately $1.0 \times 10^7$ A/cm$^2$, with a pulse width of about 2 ns. The plot 800 shows the results for P→AP switching for $H_k$=0.95 T 802a, $H_k$=1.01 T 804a and $H_k$=1.06 T 806a, and the results for AP→P switching for $H_k$=0.95 T 802b, $H_k$=1.01 T 804b and $H_k$=1.06 T 806b. The results illustrate the separability of the ferromagnetic soft layers' frequency bandwidths.

In various embodiments, independent switching of the magnetizations of two ferromagnetic soft layers using two different switching current amplitudes (e.g. $J_{low}$ and $J_{high}$) may be possible, where for example, the resonance frequency of one ferromagnetic soft layer (e.g. free layer 1) is low, while the resonance frequency of the other ferromagnetic soft layer (e.g. free layer 2) is high, and that the resonance frequencies are sufficiently far apart.

As a non-limiting example, when $J_{low}$ is applied, the oscillating ferromagnetic structures have a low frequency, and FISTS may be optimal for free layer 1, due to its low resonance frequency, but not for free layer 2, and hence switching only occurs for free layer 1. In a similar manner, when $J_{high}$ is applied, the oscillating ferromagnetic structures have a high frequency, and FISTS may be optimal for free layer 2, due to its high resonance frequency, but not for free layer 1, and hence switching only occurs for free layer 2. The frequencies need to be sufficiently far apart so that the frequency bandwidths of the two ferromagnetic soft layer s do not overlap at the operating current amplitudes.

Figure 9A:
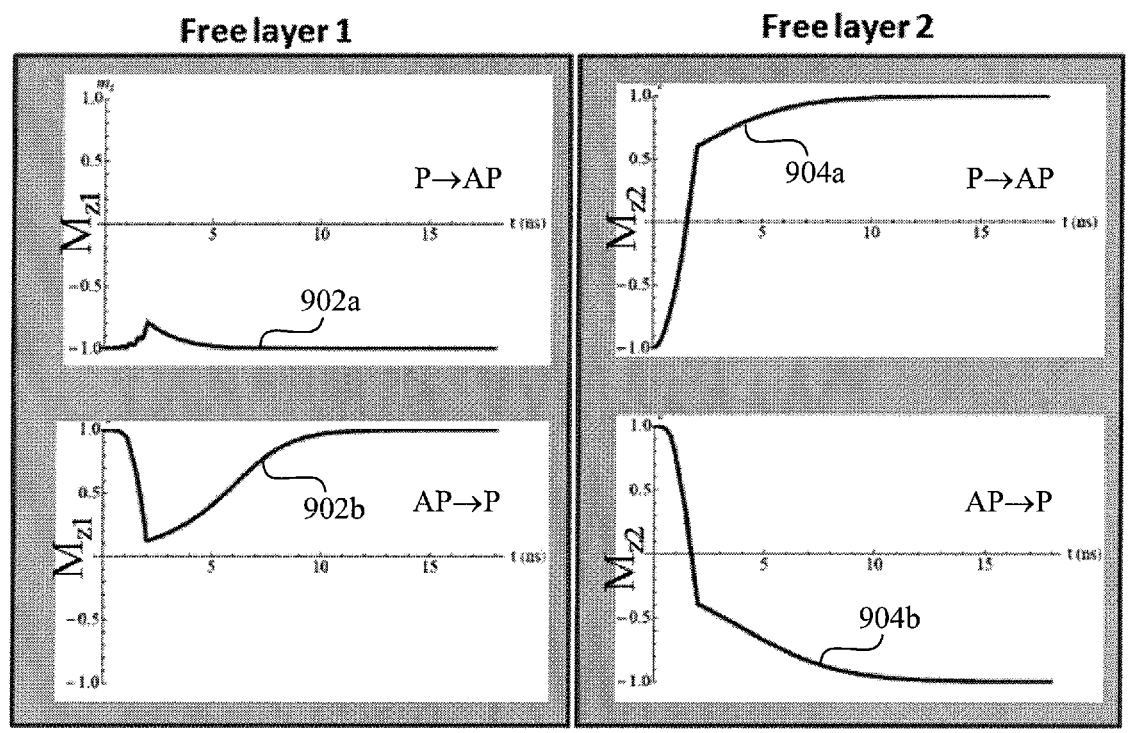
FIGS. 9A and 9B show plots of macrospin simulation results of the respective perpendicular magnetization components, Mz, of two ferromagnetic soft layers for a 2-bit STT-MRAM device, as a function of time, according to various embodiments.

FIG. 9A shows plots of macrospin simulation results of the respective perpendicular magnetization components, Mz, of two ferromagnetic soft layers for a 2-bit STT-MRAM device, as a function of time, according to various embodiments. The perpendicular anisotropy field, $H_k$, and the thickness, t, may be varied for the two ferromagnetic soft layers, with all other parameters kept constant, so as to change the optimum switching frequencies. The parameters corresponding to one ferromagnetic soft layer (e.g. free layer 1) are $\alpha_1=0.01$, $M_{S1}=1000$ emu/cm$^3$, $\gamma_1=1.76\times10^7$ Oe$^{-1}$ s$^{-1}$, $H_{k1}=1.5$ T, $t_1=1.2$ nm, $P_{ref}=0.4$, $P_{osc1}=0.4$, while the parameters corresponding to the other ferromagnetic soft layer (e.g. free layer 2) are $\alpha_2=0.01$, $M_{S2}=1000$ emu/cm$^3$, $\gamma_2=1.76\times10^7$ Oe$^{-1}$ s$^{-1}$, $H_{k2}=1.4$ T, $t_2=1.5$ nm, $P_{ref}=0.4$, $P_{osc2}=0.4$. The applied constant current density, is approximately 6.5×10$^6$ A/cm$^2$, with a pulse width of about 2 ns.

As shown in FIG. 9A, when $J_{low}$, of approximately 6.5×10$^6$ A/cm$^2$ is applied for about 2 ns, the switching of the magnetization of free layer 1 does not occur for both P→AP 902a and AP→P 902b. On the other hand, under the same conditions, magnetization switching for free layer 2 occurs for both P→AP 904a and AP→P 904b.

Figure 9B:
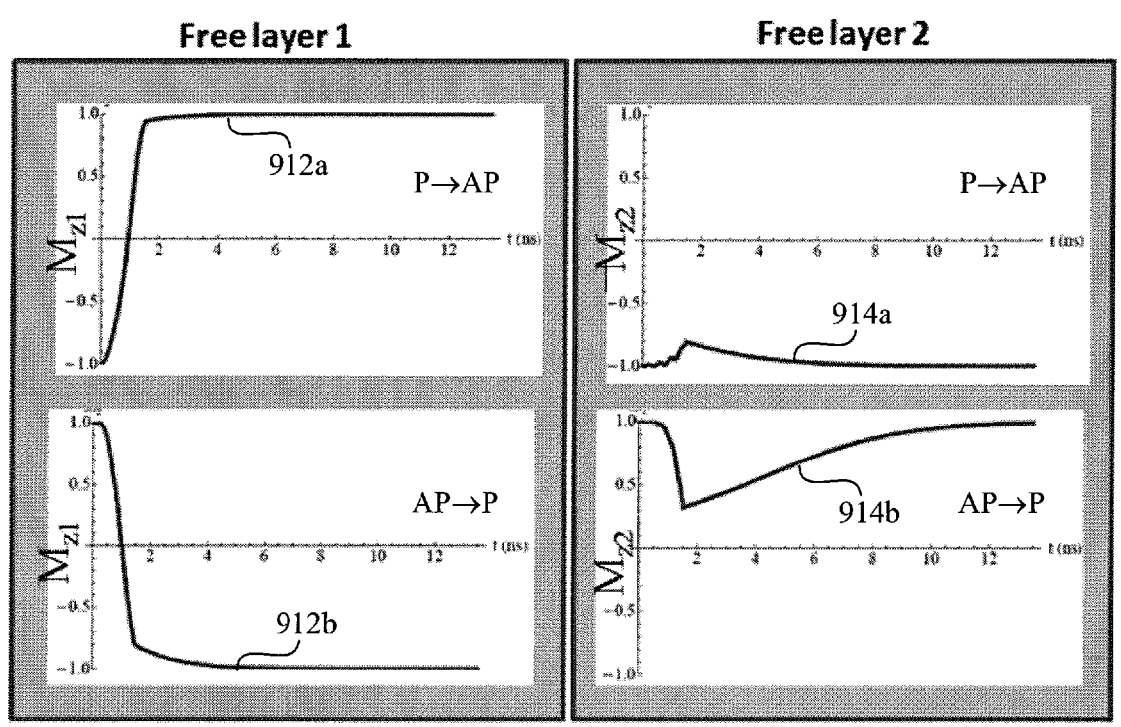

FIG. 9B shows plots of macrospin simulation results of the respective perpendicular magnetization components, Mz, of two ferromagnetic soft layers for a 2-bit STT-MRAM device, as a function of time, according to various embodiments. The perpendicular anisotropy field, $H_k$, and the thickness, t, may be varied for the two ferromagnetic soft layers, with all other parameters kept constant, so as to change the optimum switching frequencies. The parameters corresponding to one ferromagnetic soft layer (e.g. free layer 1) are $\alpha_1=0.01$, $M_{S1}1000$ emu/cm$^3$, $\gamma_1=1.76\times10^7$ Oe$^{-1}$ s$^{-1}$, $H_{k1}=1.5$ T, $t_1=1.2$ nm, $P_{ref}=0.4$, $P_{osc1}=0.4$, while the parameters corresponding to the other ferromagnetic soft layer (e.g. free layer 2) are $\alpha_2=0.01$, $M_{S2}=1000$ emu/cm$^3$, $\gamma_2=1.76\times10^7$ Oe$^{-1}$ s$^{-1}$, $H_{k2}=1.4$ T, $t_2=1.5$ nm, $P_{ref}=0.4$, $P_{osc2}=0.4$. The applied constant current density, $J_{high}$, is approximately 1.0×10$^7$ A/cm$^2$, with a pulse width of about 1.5 ns.

As shown in FIG. 9B, when $J_{high}$, of approximately 1.0×10$^7$ A/cm$^2$ is applied for about 1.5 ns, the switching of the magnetization of free layer 1 occurs for both P→AP 912a and AP→P 912b. On the other hand, under the same conditions, magnetization switching for free layer 2 does not occur for both P→AP 914a and AP→P 914b.

The results of FIGS. 9A and 9B illustrate the possibility of independent switching of magnetizations of two ferromagnetic soft layers (or free layers) having different properties.

The results for magnetoresistive devices based on the Oscillator Selection Switching Scheme (OSSS) will now be described by way of the following non-limiting examples.

Figure 10:
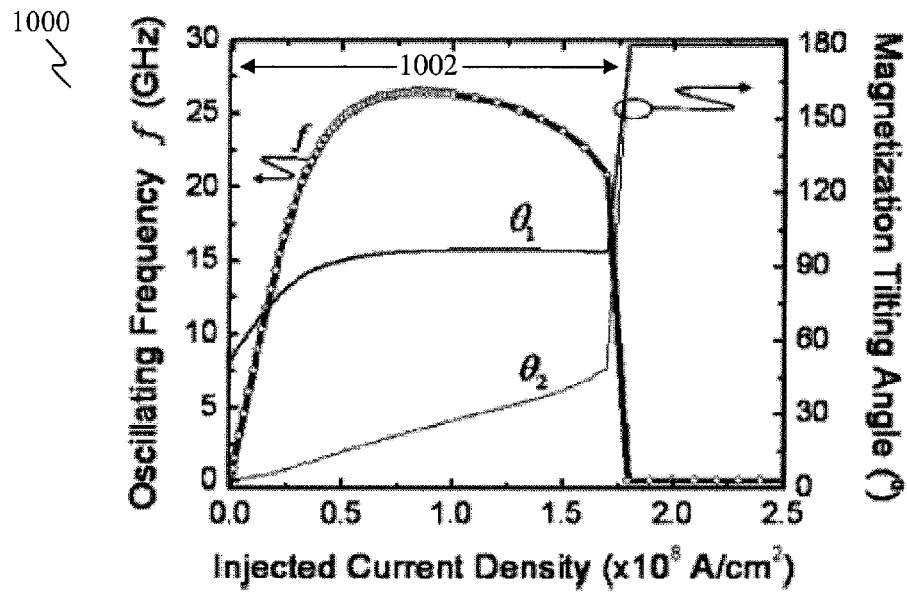
FIG. 10 shows a plot of an oscillator's frequency as a function of applied current density.

FIG. 10 shows a plot 1000 of an oscillator's frequency as a function of applied current density. FIG. 10 illustrates that an out-of-plane spin torque oscillator has two critical current densities, and oscillations only occur within the range 1002 of applied current densities between the two critical current densities.

For the Oscillator Selection Switching Scheme (OSSS) to be employed for multi-bit per cell STT-MRAM, the operating current amplitudes may be chosen such that only one oscillator or oscillating ferromagnetic structure is oscillating (hereinafter referred as "ON"), while the remaining oscillators or oscillating ferromagnetic structure are not oscillating (hereinafter referred as "OFF"), e.g. the current amplitude applied is within the range of operating current amplitudes of only one oscillator.

In various embodiments, the frequency and critical currents of a spin torque oscillating ferromagnetic structure may be controlled via intrinsic material parameters such as a (Gilbert damping constant), $M_s$ (saturation magnetization), $H_k$ (perpendicular anisotropy field) and t (thickness) of the oscillating ferromagnetic structure. As a non-limiting example, in embodiments of magnetoresistive devices having two oscillating ferromagnetic structures, the two oscillating ferromagnetic structures may be designed to have different critical currents, and the resonance frequencies of the corresponding ferromagnetic soft layers may also be designed and adjusted over a wide range. As shown in FIG. 7, by having ferromagnetic soft layers with different $H_k$, the resonance frequencies of the ferromagnetic soft layers may be tuned to match the frequencies of the corresponding oscillating ferromagnetic structures.

Figures 11A, 11B:
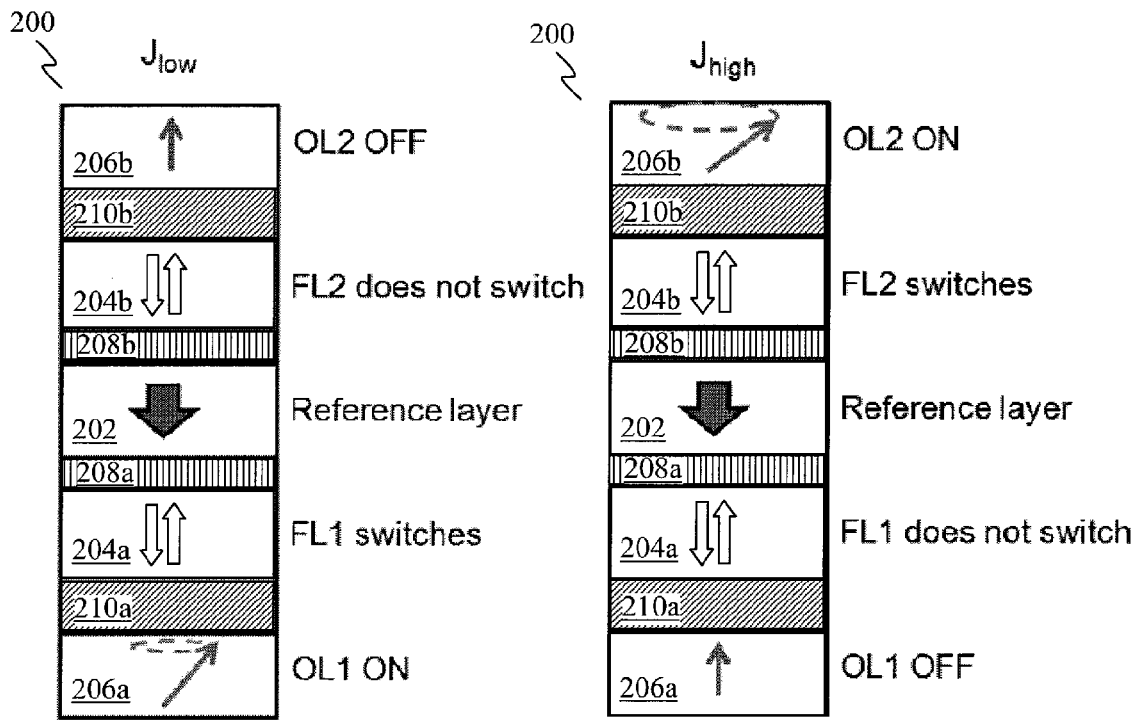
FIGS. 11A and 11B show schematic cross-sectional views of the magnetoresistive device of FIG. 2A employing OSSS, in operation.

FIGS. 11A and 11B show schematic cross-sectional views of the magnetoresistive device 200 of FIG. 2A employing OSSS, in operation, according to various embodiments, using the switching current amplitudes, $J_{low}$ and $J_{high}$, respectively. The ferromagnetic soft layers are referred to as FLs (free layers) and the oscillating ferromagnetic structures are referred to as OLs (oscillating layers).

FIGS. 11A and 11B illustrate the independent switching of the magnetizations of the two ferromagnetic soft layers using two different switching current amplitudes ($J_{low}$ and $J_{high}$), where one of the oscillating ferromagnetic structures is ON while the other oscillating ferromagnetic structure is OFF.

As a non-limiting example, when $J_{low}$ is applied, OL1 206a may be ON and FISTS is in effect for FL1 204a, and the magnetization orientation of FL1 204a switches within the duration of the width of the current pulse of $J_{low}$ applied. At the same time, OL2 206b is OFF as the applied current, $J_{low}$, is too low to induce oscillation in OL2 206b, and FISTS is not in effect for FL2 204b, and its magnetization orientation therefore does not switch.

When $J_{high}$ is applied, OL1 206a may be OFF as the applied current, $J_{high}$, is too high to induce oscillation in OL1 206a and FISTS is not in effect for FL1 204a, and the magnetization orientation of FL1 204a therefore does not switch within the duration of the width of the current pulse of $J_{high}$ applied. At the same time, OL2 206b is ON and FISTS is in effect for FL2 204b, and its magnetization orientation therefore switches.

Figure 12A:
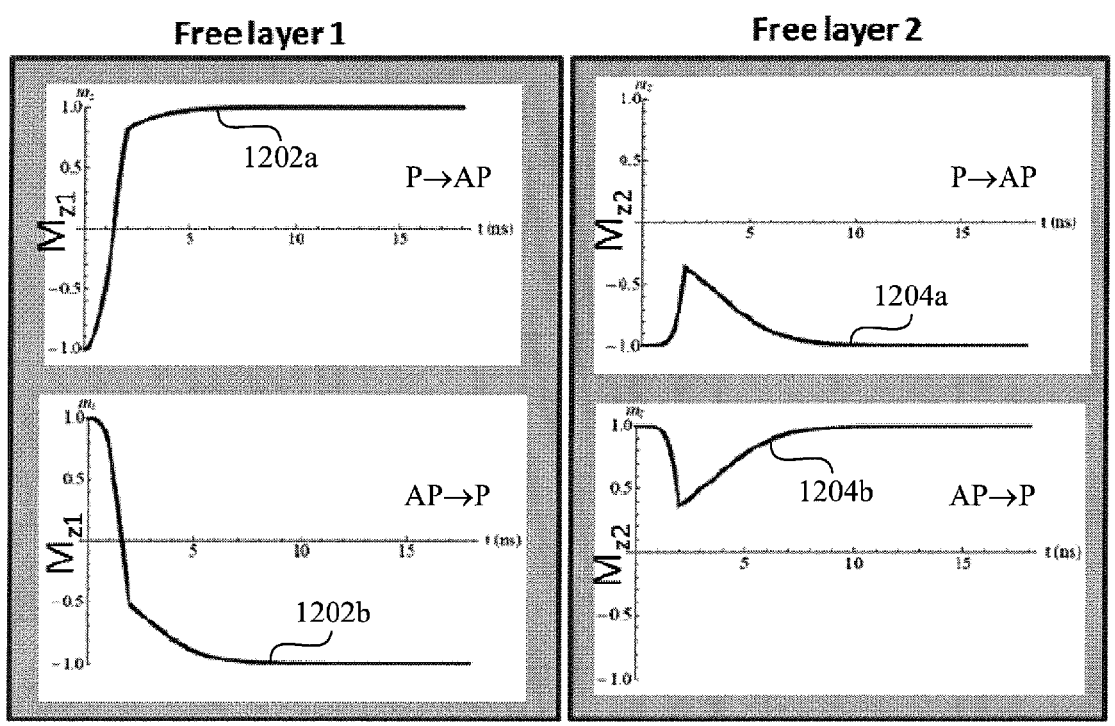
FIGS. 12A and 12B show plots of macrospin simulation results of the respective perpendicular magnetization components, Mz, of two ferromagnetic soft layers for a 2-bit STT-MRAM device, as a function of time, according to various embodiments.

FIG. 12A shows plots of macrospin simulation results of the respective perpendicular magnetization components, Mz, of two ferromagnetic soft layers for a 2-bit STT-MRAM device, as a function of time, according to various embodiments. The parameters corresponding to both ferromagnetic soft layers (e.g. free layers 1 and 2) are $\alpha=0.01$, $M_s=1100$ emu/cm$^3$, $\gamma=1.76\times10^7$ Oe$^{-1}$ s$^{-1}$, $H_k=1.6$ T, t=1.2 nm, $P_{ref}=0.4$, $P_{osc}=0.4$. The applied constant current density, $J_{low}$, is approximately 6.5×10$^6$ A/cm$^2$, with a pulse width of about 2 ns. The oscillating ferromagnetic structures corresponding to free layer 1 and free layer 2 are ON and OFF respectively, at this applied current density, $J_{low}$.

As shown in FIG. 12A, when $J_{low}$ of approximately 6.5× $10^6$ A/cm² is applied for about 2 ns, the switching of the magnetization orientation of free layer 1 occurs for both P→AP 1202*a* and AP→P 1202*b*. On the other hand, under the same conditions, magnetization switching for free layer 2 does not occur for both P→AP 1204*a* and AP→P 1204*b*.

Figure 12B:
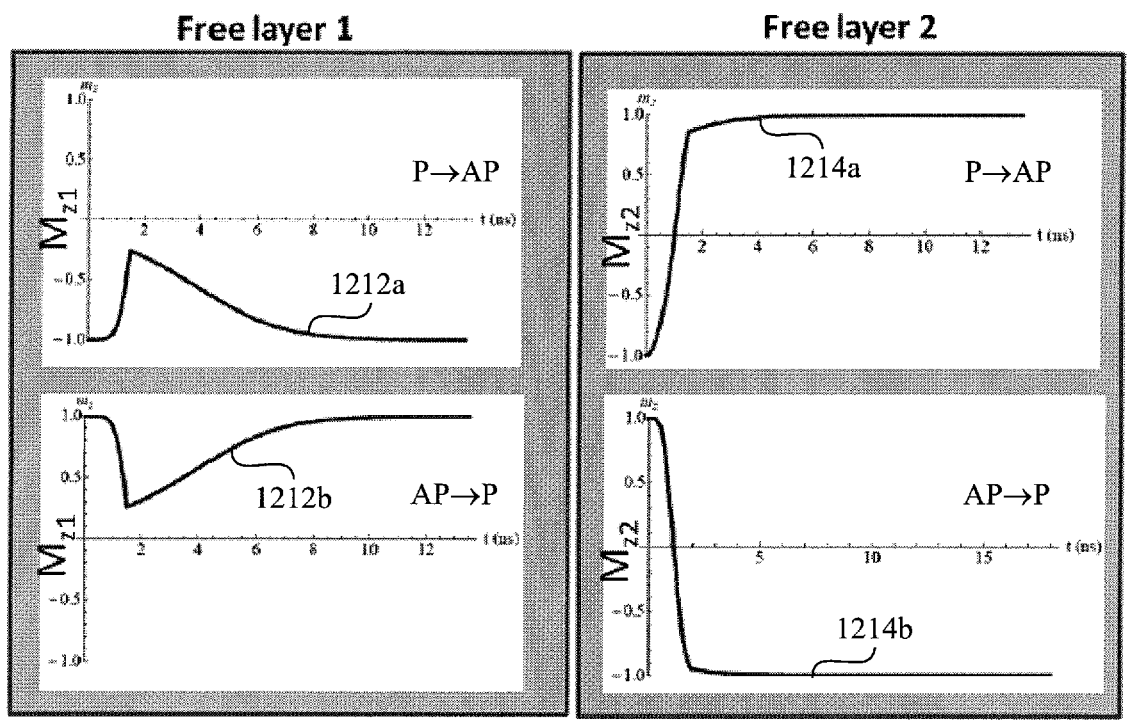

FIG. 12B shows plots of macrospin simulation results of the respective perpendicular magnetization components, Mz, of two ferromagnetic soft layers for a 2-bit STT-MRAM device, as a function of time, according to various embodiments. The parameters corresponding to both ferromagnetic soft layers (e.g. free layers 1 and 2) are α=0.01, $M_s$=1100 emu/cm³, γ=1.76×10⁷ Oe⁻¹ s⁻¹, $H_k$=1.6 T, t=1.2 nm, $P_{ref}$=0.4, $P_{osc}$ =0.4. The applied constant current density, $J_{high}$, is approximately 1.0×10⁷ A/cm², with a pulse width of about 1.5 ns. The oscillating ferromagnetic structures corresponding to free layer 1 and free layer 2 are OFF and ON respectively, at this applied current density, $J_{high}$.

As shown in FIG. 12B, when $J_{high}$ of approximately 1.0× 10⁷ A/cm² is applied for about 1.5 ns, the switching of the magnetization orientation of free layer 1 does not occur for both P→AP 1212*a* and AP→P 1212*b*. On the other hand, under the same conditions, magnetization switching for free layer 2 occurs for both P→AP 1214*a* and AP→P 1214*b*.

The results of FIGS. 12A and 12B illustrate the possibility of independent switching of magnetizations of two ferromagnetic soft layers (or free layers) where the corresponding oscillating ferromagnetic structures have different properties. The two ferromagnetic soft layers may be identical or at least substantially similar, e.g. in terms of properties and parameters.

Various embodiments may provide n-bit per cell STT-MRAMs (e.g. n≥1, e.g. 1, 2, 3, 4, 5, 6 or any higher number) based on the Frequency Selection Switching Scheme (FSSS) or the Oscillator Selection Switching Scheme (OSSS). The n-bit per cell STT-MRAMs may be formed based on the magnetoresistive device 200 (FIG. 2A), being a 2-bit STT-MRAM (hereinafter referred as "S2"), and/or the magnetoresistive device 220 (FIG. 2B), being a 1-bit STT-MRAM (hereinafter referred as "S1"). Therefore, any n-bit per cell STT-MRAM may be achieved by arranging or stacking an apropriate number of S1 (e.g. magnetoresistive device 220) and/or S2 (e.g. magnetoresistive device 200), one over the other in a stack, so that there are n bits in the overall stack.

Adjacent stack arrangements of S1s and/or S2s (e.g. adjacent S1/S1, S2/S2 and S1/S2) may be separated by a stack separating layer of a conductive and non-magnetic material, including but not limited to one or more of copper (Cu), silver (Ag), gold (Au), tantalum (Ta), chromium (Cr), palladium (Pd), platinum (Pt) or ruthenium (Ru). However, it should be appreciated that the stack separating layer between adjacent stacks may alternatively be of a non-conductive and non-magnetic material, including but not limited to one or more of magnesium oxide (MgO), aluminium oxide ($AlO_x$), or titanium oxide ($TiO_x$).

In various embodiments, the n-bit per cell STT-MRAM may be a giant magnetoresistance (GMR) device, with all the separating layers in the overall stack being of a conductive and non-magnetic material.

Figures 13A, 13B:
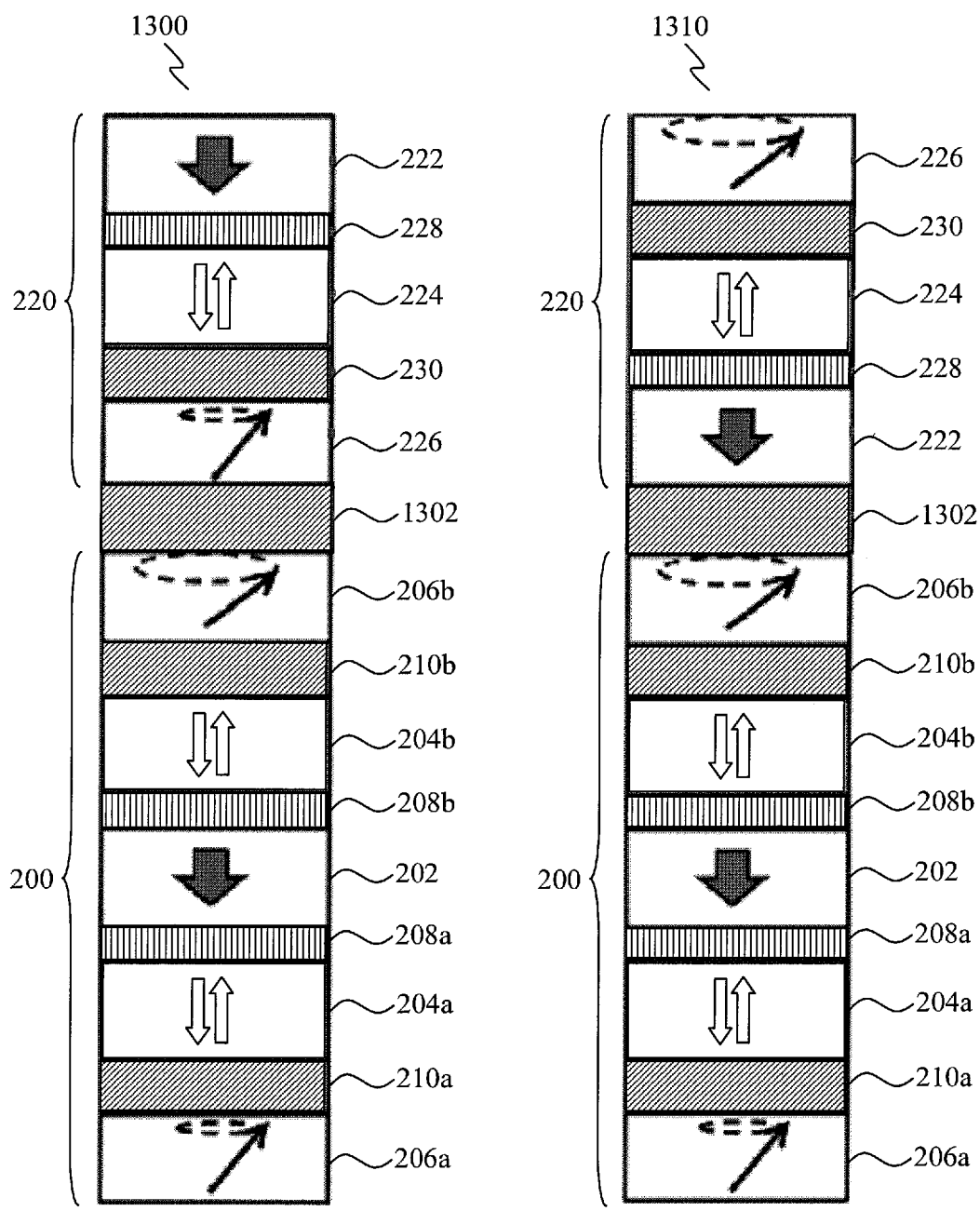
FIGS. 13A and 13B show schematic cross-sectional views of a magnetoresistive device, according to various embodiments.

FIG. 13A shows a schematic cross-sectional view of a magnetoresistive device 1300, according to various embodiments, illustrating a non-limiting example of a 3-bit spin transfer torque magnetoresistive random access memory (STT-MRAM), for implementation using the Frequency Selection Switching Scheme (FSSS) or the Oscillator Selection Switching Scheme (OSSS).

The magnetoresistive device 1300 may be a giant magnetoresistive (GMR) device or a tunneling magnetoresistive (TMR) device, e.g. a spin transfer torque magnetic random access memory (STT-MRAM) with perpendicular anisotropy. The magnetoresistive device 1300 has a stack structure, having for example a plurality of ferromagnetic layers.

As a non-limiting example, the magnetoresistive device 1300 may include the stack arrangement of the magnetoresistive device 200 (i.e. S2), which may be as described in the context of the embodiments of FIG. 2A, to provide 2 bits per cell. An additional stack arrangement of a ferromagnetic hard layer 222, a ferromagnetic soft layer 224, and an oscillating ferromagnetic structure 226, e.g. of the magnetoresistive device 220 (i.e. S1), which may be as described in the context of the embodiments of FIG. 2B, may be arranged on top of the magnetoresistive device 200, to provide an additional 1 bit (i.e. an S1 stacked on top of an S2). The magnetoresistive device 1300 further includes a stack separating layer 1302 of a conductive and non-magnetic material (e.g. Cu) or a non-conductive and non-magnetic material (e.g. MgO). In further embodiments, the magnetoresistive device 200 (i.e. S2) may alternatively be arranged on top of the magnetoresistive device 220 (i.e. S1) (i.e. an S2 stacked on top of an S1).

FIG. 13B shows a schematic cross-sectional view of a magnetoresistive device 1310, according to various embodiments, illustrating a further non-limiting example of a 3-bit spin transfer torque magnetoresistive random access memory (STT-MRAM), for implementation using the Frequency Selection Switching Scheme (FSSS) or the Oscillator Selection Switching Scheme (OSSS). The magnetoresistive device 1310 is similar to the magnetoresistive device 1300, except that the positions of the ferromagnetic hard layer 222 and the oscillating ferromagnetic structure 226 are interchanged. In further embodiments, the magnetoresistive device 200 (i.e. S2) may alternatively be arranged on top of the magnetoresistive device 220 (i.e. S1).

In further embodiments, other stack configurations may be provided to realise a 3-bit STT-MRAM, e.g. by arranging three magnetoresistive devices 220 (i.e. three S1s) one over the other.

Figure 14:
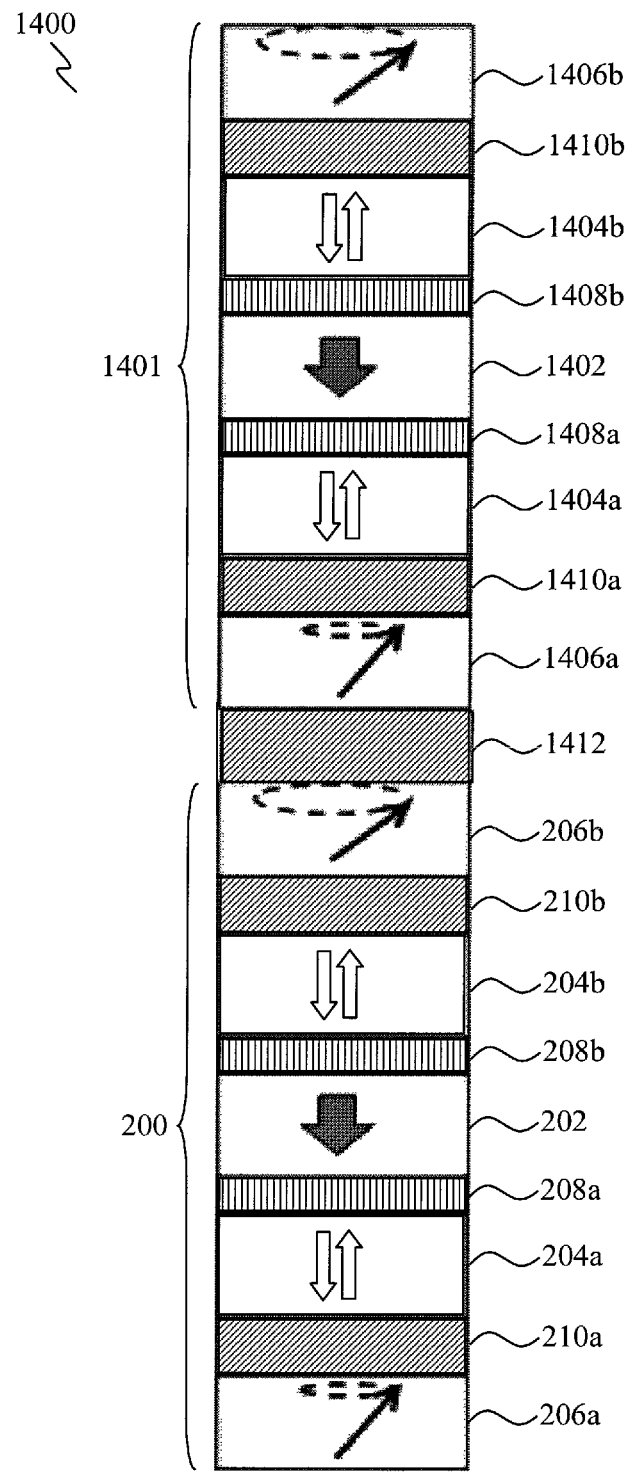
FIG. 14 shows a schematic cross-sectional view of a magnetoresistive device, according to various embodiments.

FIG. 14 shows a schematic cross-sectional view of a magnetoresistive device 1400, according to various embodiments, illustrating a non-limiting example of a 4-bit spin transfer torque magnetoresistive random access memory (STT-MRAM), for implementation using the Frequency Selection Switching Scheme (FSSS) or the Oscillator Selection Switching Scheme (OSSS).

The magnetoresistive device 1400 may be a giant magnetoresistive (GMR) device or a tunneling magnetoresistive (TMR) device, e.g. a spin transfer torque magnetic random access memory (STT-MRAM) with perpendicular anisotropy. The magnetoresistive device 1400 has a stack structure, having for example a plurality of ferromagnetic layers.

As a non-limiting example, the magnetoresistive device 1400 may include the stack arrangement of the magnetoresistive device 200 (i.e. S2), which may be as described in the context of the embodiments of FIG. 2A, to provide 2 bits per cell. An additional stack arrangement of a magnetoresistive device 1401, may be arranged on top of the magnetoresistive device 200, to provide additional 2 bits (i.e. two S2 stacked over each other). The magnetoresistive device 1401 includes a ferromagnetic hard layer 1402, two ferromagnetic soft layers 1404*a*, 1404*b*, arranged adjacent to the ferromagnetic hard layer with respective separating layers 1408*a*, 1408*b* in between, and two oscillating ferromagnetic structures 1406*a*, 1406b arranged adjacent to the corresponding ferromagnetic soft layers 1404a, 1404b, with respective separating layers 1410a, 1410b in between. The magnetoresistive device 1401 may be similar to the magnetoresistive device 200 as described in the context of the embodiments of FIG. 2A. The magnetoresistive device 1400 further includes a stack separating layer 1412 of a conductive and non-magnetic material (e.g. Cu) or a non-conductive and non-magnetic material (e.g. MgO). In further embodiments, the magnetoresistive device 200 (i.e. S2) may alternatively be arranged on top of the magnetoresistive device 1401 (i.e. S2).

In further embodiments, other stack configurations may be provided to realise a 4-bit STT-MRAM, e.g. by arranging four magnetoresistive devices 220 (i.e. four S1s) one over the other, or arranging a magnetoresistive device 200 or 1401 (i.e. one S2) and two magnetoresistive devices 220 (i.e. two S1s), one over the other.

In the context of various embodiments, the FSSS writing scheme may help to switch the magnetization orientation of each ferromagnetic soft layer, without at least substantially affecting the remaining ferromagnetic soft layer(s). The FSSS writing scheme is based on frequency selection for each ferromagnetic soft layer, where the frequency may be close to or equal to a resonance frequency of the ferromagnetic soft layer, which may be tailored through the intrinsic properties of each ferromagnetic soft layer.

In the context of various embodiments, the OSSS writing scheme may help to switch the magnetization orientation of each ferromagnetic soft layer, without at least substantially affecting the remaining ferromagnetic soft layer(s). The OSSS writing scheme is based on oscillator selection for each ferromagnetic soft layer, for example using the property of critical currents to turn each oscillator or oscillating ferromagnetic structure corresponding to a ferromagnetic soft layer, ON or OFF independently.

While the invention has been particularly shown and described with reference to specific embodiments, it should be understood by those skilled in the art that various changes in form and detail may be made therein without departing from the spirit and scope of the invention as defined by the appended claims. The elements of the various embodiments may be incorporated into each of the other species to obtain the benefits of those elements in combination with such other species, and the various beneficial features may be employed in embodiments alone or in combination with each other. The scope of the invention is thus indicated by the appended claims and all changes which come within the meaning and range of equivalency of the claims are therefore intended to be embraced.

The invention claimed is:

1. A magnetoresistive device, comprising:
at least two ferromagnetic soft layers;
wherein the at least two ferromagnetic soft layers have different ranges of magnetization switching frequencies.

2. The magnetoresistive device of claim 1, wherein the range of magnetization switching frequencies of each ferromagnetic soft layer is close to a resonance frequency of the ferromagnetic soft layer.

3. The magnetoresistive device of claim 1, wherein the range of magnetization switching frequencies of each ferromagnetic soft layer is non-overlapping or has a tolerable overlapping region.

4. The magnetoresistive device of claim 1, wherein each ferromagnetic soft layer is associated with an optimum magnetization switching frequency that is within the range of magnetization switching frequencies of the ferromagnetic soft layer.

5. The magnetoresistive device of claim 4, wherein the optimum magnetization switching frequency of each ferromagnetic soft layer is close to or equal to a resonance frequency of the ferromagnetic soft layer.

6. The magnetoresistive device of claim 1, wherein each ferromagnetic soft layer has a corresponding oscillating ferromagnetic structure disposed on one side of the ferromagnetic soft layer.

7. The magnetoresistive device of claim 6,
wherein each ferromagnetic soft layer is associated with an optimum magnetization switching frequency that is within the range of magnetization switching frequencies of the ferromagnetic soft layer, and
wherein the optimum magnetization switching frequency of each ferromagnetic soft layer is close to an oscillation frequency of the corresponding oscillating ferromagnetic structure.

8. The magnetoresistive device of claim 4, wherein the optimum magnetization switching frequency of each ferromagnetic soft layer is the magnetization switching frequency at which magnetization of the ferromagnetic soft layer switches in the fastest time for a current pulse of a particular amplitude and time width.

9. The magnetoresistive device of claim 1, comprising:
a first stack arrangement comprising a ferromagnetic hard layer, a first ferromagnetic soft layer, a second ferromagnetic soft layer, a first oscillating ferromagnetic structure, and a second oscillating ferromagnetic structure,
wherein the first oscillating ferromagnetic structure is disposed at one side of the first ferromagnetic soft layer and the second oscillating ferromagnetic structure is disposed at one side of the second ferromagnetic soft layer; and
wherein the ferromagnetic hard layer is disposed at the other side of each of the first ferromagnetic soft layer and the second ferromagnetic soft layer such that the ferromagnetic hard layer is disposed between the first ferromagnetic soft layer and the second ferromagnetic soft layer.

10. The magnetoresistive device of claim 9, further comprising:
a second stack arrangement comprising a further ferromagnetic hard layer, a third ferromagnetic soft layer, and a third oscillating ferromagnetic structure,
wherein the third ferromagnetic soft layer is disposed between the further ferromagnetic hard layer and the third oscillating ferromagnetic structure.

11. A magnetoresistive device, comprising:
at least two oscillating ferromagnetic structures;
wherein ranges of operating current amplitudes at which oscillations are induced for the at least two oscillating ferromagnetic structures are different.

12. The magnetoresistive device of claim 11, wherein the ranges of operating current amplitudes at which oscillations are induced for the at least two oscillating ferromagnetic structures are non-overlapping or have a tolerable overlapping region respectively.

13. The magnetoresistive device of claim 11, further comprising:
at least two ferromagnetic soft layers;
wherein each oscillating ferromagnetic structure is disposed at one side of a corresponding ferromagnetic soft layer.

14. The magnetoresistive device of claim 13, wherein each ferromagnetic soft layer is configured to switch magnetization from a parallel state to an anti-parallel state or from an anti-parallel state to a parallel state when an operating current amplitude is within the range of operating current amplitudes at which oscillations are induced for the corresponding oscillating ferromagnetic structure.

15. The magnetoresistive device of any one of claim 11, wherein each oscillating ferromagnetic structure has an oscillation frequency.

16. The magnetoresistive device of claim 15, wherein the range of operating current amplitudes at which oscillations are induced for each oscillating ferromagnetic structure and the oscillation frequency of each oscillating ferromagnetic structure are dependent on one or more of a group of parameters consisting of Gilbert damping constant of the oscillating ferromagnetic structure, saturation magnetization of the oscillating ferromagnetic structure, perpendicular anisotropy field of the oscillating ferromagnetic structure and thickness of the oscillating ferromagnetic structure.

17. The magnetoresistive device of any one of claim 11, comprising:
a first stack arrangement comprising a ferromagnetic hard layer, a first ferromagnetic soft layer, a second ferromagnetic soft layer, a first oscillating ferromagnetic structure, and a second oscillating ferromagnetic structure,
wherein the first oscillating ferromagnetic structure is disposed at one side of the first ferromagnetic soft layer and the second oscillating ferromagnetic structure is disposed at one side of the second ferromagnetic soft layer; and
wherein the ferromagnetic hard layer is disposed at the other side of each of the first ferromagnetic soft layer and the second ferromagnetic soft layer such that the ferromagnetic hard layer is disposed between the first ferromagnetic soft layer and the second ferromagnetic soft layer.

18. The magnetoresistive device of any one of claim 17, further comprising:
a second stack arrangement comprising a further ferromagnetic hard layer, a third ferromagnetic soft layer, and a third oscillating ferromagnetic structure,
wherein the third ferromagnetic soft layer is disposed between the further ferromagnetic hard layer and the third oscillating ferromagnetic structure.

* * * * *